(12) United States Patent
Kaida et al.

(10) Patent No.: US 6,201,337 B1
(45) Date of Patent: Mar. 13, 2001

(54) THICKNESS EXTENSIONAL VIBRATION PIEZOELECTRIC RESONATOR AND PIEZOELECTRIC RESONANCE DEVICE

(75) Inventors: Hiroaki Kaida, Moriyama; Toru Nagae, Omihachiman, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/452,741

(22) Filed: Dec. 1, 1999

(30) Foreign Application Priority Data

Dec. 16, 1998 (JP) .................................................. 10-357752

(51) Int. Cl.[7] .............................. H03H 9/17; H01L 41/08
(52) U.S. Cl. ........................................... 310/321; 310/366
(58) Field of Search .................................. 310/321, 320, 310/359, 357, 365, 366, 368

(56) References Cited

U.S. PATENT DOCUMENTS

| | | | |
|---|---|---|---|
| 4,894,580 | * 1/1990 | Ogawa | 310/320 |
| 4,900,970 | * 2/1990 | Ando et al. | 310/320 |
| 4,939,403 | * 7/1990 | Kittaka et al. | 310/320 |
| 5,274,293 | * 12/1993 | Inoue et al. | 310/320 |
| 5,959,391 | * 9/1999 | Ogiso et al. | 310/359 |
| 6,014,799 | * 3/2000 | Kaida | 29/25.35 |
| 6,040,652 | * 3/2000 | Kaida | 310/320 |
| 6,051,910 | * 4/2000 | Kaida et al. | 310/320 |
| 6,051,916 | * 4/2000 | Kaida et al. | 310/368 |
| 6,107,727 | * 8/2000 | Kaida et al. | 310/366 |
| 6,121,718 | * 9/2000 | Mohr | 310/334 |

FOREIGN PATENT DOCUMENTS

| | | | |
|---|---|---|---|
| 1-117409 | 5/1989 | (JP) . | |
| 2-235422 | 9/1990 | (JP) . | |
| 41100413 | * 1/1999 | (JP) | H03H/9/17 |

\* cited by examiner

*Primary Examiner*—Thomas M. Dougherty
(74) *Attorney, Agent, or Firm*—Keating & Bennett, LLP

(57) ABSTRACT

A thickness-extensional piezoelectric resonator using a harmonic of a thickness-extensional vibration mode has a compact size, large electric capacity, is not affected by the stray capacitance of a circuit board, and has small variations in resonance characteristics. The thickness-extensional piezoelectric resonator includes a piezoelectric body, a first excitation electrode, a second excitation electrode, a terminal electrode and a connection electrode disposed on outer surfaces of the piezoelectric body, as well as an internal electrode inside of the piezoelectric body. Portions where the first excitation electrode, the second excitation electrode and the internal electrode overlap define a resonating portion. In the length direction of the piezoelectric body, a vibration-attenuating portion is defined at opposite sides of the resonating portion, whereas in the width direction, the vibration-attenuating portion is not provided at each side thereof. In addition, a relationship of $Go/D \geq 2.0$ is satisfied, wherein Go represents a distance between the terminal electrode and the first excitation electrode, D is substantially equal to T/N, and wherein T is the thickness of the piezoelectric body and N is the order of harmonic vibrations.

22 Claims, 16 Drawing Sheets

THICKNESS EXTENSIONAL VIBRATION PIEZOELECTRIC RESONATOR AND PIEZOELECTRIC RESONANCE DEVICE

BACKGROUND OF THE INVENTION

1. Field of the Invention

The present invention relates to a piezoelectric resonator and a piezoelectric resonance device for use as different kinds of resonators, oscillators, or similar apparatuses, and more particularly, to a thickness extensional piezoelectric resonator and a piezoelectric resonance device each operative to use higher harmonics of a thickness extensional vibration mode.

2. Description of the Related Art

Piezoelectric resonators are used in a variety of piezoelectric resonation devices such as piezoelectric oscillators, piezoelectric filters, and so forth.

Japanese Unexamined Patent Publication No. 1-117409 discloses an energy-trap type piezoelectric resonator operative to utilize the second harmonic in a thickness extensional vibration mode. This piezoelectric resonator will be described with reference to FIGS. 22 and 23.

The above-mentioned piezoelectric resonator is formed by laminating ceramic green sheets 61 and 62 made of a piezoelectric material, and firing them integrally, as shown in the exploded perspective view of FIG. 22. A circular excitation electrode 63 is provided on the ceramic green sheet 61 in the center thereof. The excitation electrode 63 is led out to one of the side edges of the ceramic green sheet 61 through a lead electrode 64. Further, a circular excitation electrode 65 is provided in the center of the upper side of the ceramic green sheet 62. The excitation electrode 65 is led out to one of the side edges of the ceramic green sheet 62 through a lead electrode 66. An excitation electrode 67 is provided on the underside of the ceramic green sheet 62, and is lead out to the side edge of the ceramic green sheet 62 through an lead electrode 68, as shown in the downward projection.

The above-mentioned ceramic green sheets 61 and 62 are laminated, pressed in the thickness direction, and baked. The obtained sintered material is polarized whereby a piezoelectric resonator 70 as shown in FIG. 23 is produced.

In the piezoelectric resonator 70, piezoelectric layers 71 and 72 are uniformly polarized in the thickness direction, namely, in the direction indicated by the arrows in FIG. 23.

The piezoelectric resonator 70 can be resonated by connecting in common the excitation electrodes 63 and 67, and applying an AC voltage between the excitation electrodes 63, 67, and 65. In this case, the vibration energy is trapped in the area where the excitation electrodes 63, 65, and 67 overlap, which defines a resonance portion A.

The prior art piezoelectric resonator 70 which is operative to use higher harmonics in a thickness extensional vibration mode is provided as an energy-trapping piezoelectric resonator, as described above. Accordingly, it is necessary to provide a vibration-attenuating portion at the periphery of the resonance portion A for attenuation of the vibration. That is, it is necessary to provide the vibration attenuating portion having an area which is larger than that of the resonance portion A. Therefore, it becomes difficult to miniaturize the piezoelectric resonator 70.

Japanese Unexamined Patent Publication No. 2-235422 discloses an energy-trap type piezoelectric resonator containing a strip-type piezoelectric ceramic, which does not require a piezoelectric substrate portion having a large area located at the periphery of its resonance portion.

In the energy-trap type piezoelectric resonator 80, an excitation electrode 82a is provided on the upper side of an elongated piezoelectric substrate 81, and an excitation electrode 82b on the underside thereof. Each of the excitation electrodes 82a and 82b is arranged to extend to a pair of the long sides of the piezoelectric substrate 81, that is, to extend over the entire width. Further, the back side of the excitation electrode 82a and the front side of the excitation electrode 82b are opposed to each other in the center in the longitudinal direction of the piezoelectric substrate 81 whereby the resonance portion is defined by the overlapped portions. Further, these excitation electrodes 82a and 82b are extended to the ends 81a and 81b in the longitudinal direction of the piezoelectric substrate 81.

In the piezoelectric resonator 80, unnecessary vibrations are generated during the excitation of the thickness extensional vibration mode. Japanese Unexamined Patent Publication No. 2-235422 describes that when a fundamental wave is utilized, the ratio of W/T (width/thickness) equal to about 5.33 at a resonance frequency of 16 MHz is preferred, and when the third harmonic is utilized, unnecessary spurious components between the resonance frequency and the anti-resonance frequency can be reduced by setting the ratio of W/T at about 2.87 when the resonance frequency is about 16 MHz. In other words, when higher harmonics in a thickness extensional vibration mode are practically utilized, various unnecessary spurious vibrations appear in addition to the spurious components between the resonance and anti-resonance frequencies. Accordingly, a problem occurs that effective resonance characteristics can not be obtained.

Also referring to the piezoelectric resonator disclosed in Japanese Unexamined Patent Publication No. 2-235422, the electric capacity is relatively small so that the piezoelectric resonator is susceptible to a floating capacity generated from the circuit board other components.

SUMMARY OF THE INVENTION

To overcome the above described problems, preferred embodiments of the present invention provide a thickness extensional vibration piezoelectric resonator and a piezoelectric resonance device, each of which is operative to utilize higher harmonics in a thickness extensional vibration mode, is constructed to be miniaturized, has a large electric capacity, is not vulnerable to floating capacity generated from a circuit board, effectively suppresses the generation of undesired unnecessary spurious vibrations, and has excellent resonance characteristics.

One preferred embodiment of the present invention preferably provides a thickness extensional vibration piezoelectric resonator, including a resonance portion, a vibration-attenuating portion disposed at both sides of the resonance portion and adapted to be vibrated in an N-order higher harmonic in a thickness extensional vibration mode. The piezoelectric resonator further includes a piezoelectric body, a first excitation electrode and a second excitation electrode respectively disposed on both sides of the piezoelectric body and opposed to each other with the piezoelectric body disposed therebetween, at least one layer of an internal electrode arranged inside of the piezoelectric body and at least partially opposed to the first and second excitation electrodes through the piezoelectric layers, first and second terminal electrodes disposed on the ends in a first direction of the of the piezoelectric body and electrically connected to the first and second excitation electrodes, respectively. The first direction being a direction passing through the vibration-attenuating portions located on both sides of the resonance portion, respectively. The first and second terminal electrodes being defined by the portion of the first and second excitation electrodes and the internal electrode overlapped in the thickness direction with the piezoelectric body disposed therebetween. A ratio Go/D being substantially equal to or higher than about 2.0, in which Go is each of the distances extending in the first direction between the first and second excitation electrodes and the terminal electrodes, and D is substantially equal to T/N, wherein T is the thickness of the piezoelectric body and N is the order of harmonics of thickness extensional vibration.

According to the above described arrangement, the thickness extensional vibration piezoelectric resonator preferably includes a substantially rectangular plate-shaped piezoelectric body, first and second excitation electrodes disposed on both sides of the piezoelectric body, and at least one layer of an internal electrode arranged inside of the piezoelectric body and at least partially opposed to the first and second excitation electrodes. Accordingly, as compared with a prior art thickness extensional vibration piezoelectric resonator having no internal electrode, the electric capacity is greatly increased to such a degree as corresponds to the internal electrode, and thereby, hazardous influences caused by a floating capacity generated by the circuit board to which the thickness extensional vibration piezoelectric resonator is attached, is greatly reduced. That is, thickness extensional vibration piezoelectric resonators having high resonance characteristics can be provided. In addition, the vibration attenuating portions are preferably provided only on two opposite sides of the resonating portion. Therefore, the size of the thickness extensional vibration piezoelectric resonator can be reduced. Miniature thickness extensional vibration piezoelectric resonators can be thus provided. Moreover, the ratio Go/D is preferably about 2.0 or greater. Accordingly, unnecessary spurious vibrations between the resonance and anti-resonance frequencies are effectively suppressed.

Another preferred embodiment of the present invention provides a thickness extensional vibration piezoelectric resonator, including a resonance portion, a vibration-attenuating portion disposed at opposite sides of the resonance portion and adapted to be vibrated in a higher order harmonic in a thickness extensional vibration mode, a piezoelectric body; a plurality of excitation electrodes disposed on the main surfaces of or inside of the piezoelectric body; the resonance portion being defined by the portion of the plural excitation electrodes overlapped through the piezoelectric layers in the thickness direction, the plural excitation electrodes containing at least one layer of an internal excitation electrode; first and second terminal electrodes disposed on the ends in the first direction of the piezoelectric body and electrically connected to the first and second excitation electrodes, the first direction being a direction passing through the vibration-attenuating portions located on both sides of the resonance portion, respectively, the first and second terminal electrodes constituting portions for external connection, and a ratio Gi/D is substantially equal to or greater than about 2.0, in which Gi is each of the distances extending in the first direction between the internal excitation electrode and the terminal electrodes connected to have the opposite potential for the internal excitation electrode, and D is substantially equal to T/N, wherein T is the thickness of the piezoelectric body and N is the order of harmonics of thickness extensional vibration.

According to the above described arrangement, the thickness extensional vibration piezoelectric resonator preferably includes a substantially rectangular sheet-shaped piezoelectric body, at least one layer of the internal resonance electrode, and the plurality of excitation electrodes arranged to be overlapped through the piezoelectric body layers in the thickness direction. Accordingly, as compared with a prior art thickness extensional vibration piezoelectric resonator having no internal electrode, the electric capacity is greatly increased to such a degree that is similar to the internal electrode. As a result, hazardous influences caused by a floating capacity generated by the circuit board and other sources are minimized. Furthermore, the vibration attenuating portions are provided only on the two opposite sides of the resonating portion. Accordingly, the size of the thickness extensional vibration piezoelectric resonator is greatly reduced. At the same time, the ratio Gi/D is set at about 2.0 or greater. Accordingly, unnecessary spurious components are prevented from appearing between the resonance and anti-resonance frequencies.

Another preferred embodiment of the present invention provides a piezoelectric resonance device including a substrate member, a casing member constituting a plurality of electrodes disposed on the substrate, and the above described thickness extensional vibration piezoelectric resonator bonded to the substrate so as to assure a space which allows for free vibration of the resonator and the casing member being fixed to the substrate so as to cover the thickness extensional vibration piezoelectric resonator bonded to the substrate.

According to the above described arrangement, the piezoelectric resonance device defines an electronic device that can be surface-mounted onto a printed circuit substrate and other structures. Also, in the above described piezoelectric resonance device, the substrate may be a capacitor substrate containing a dielectric substrate and plural electrodes disposed on the dielectric substrate, and the thickness extensional vibration piezoelectric resonator may be electrically connected to a capacitor provided in the capacitor substrate.

Other features and advantages of the present invention will become apparent from the following description of the invention which refers to the accompanying drawings.

DETAILED DESCRIPTIONS OF PREFERRED EMBODIMENTS

A detailed explanation of the present invention will be provided below referring to some of the preferred embodiments of the present invention.

Figure 1A:
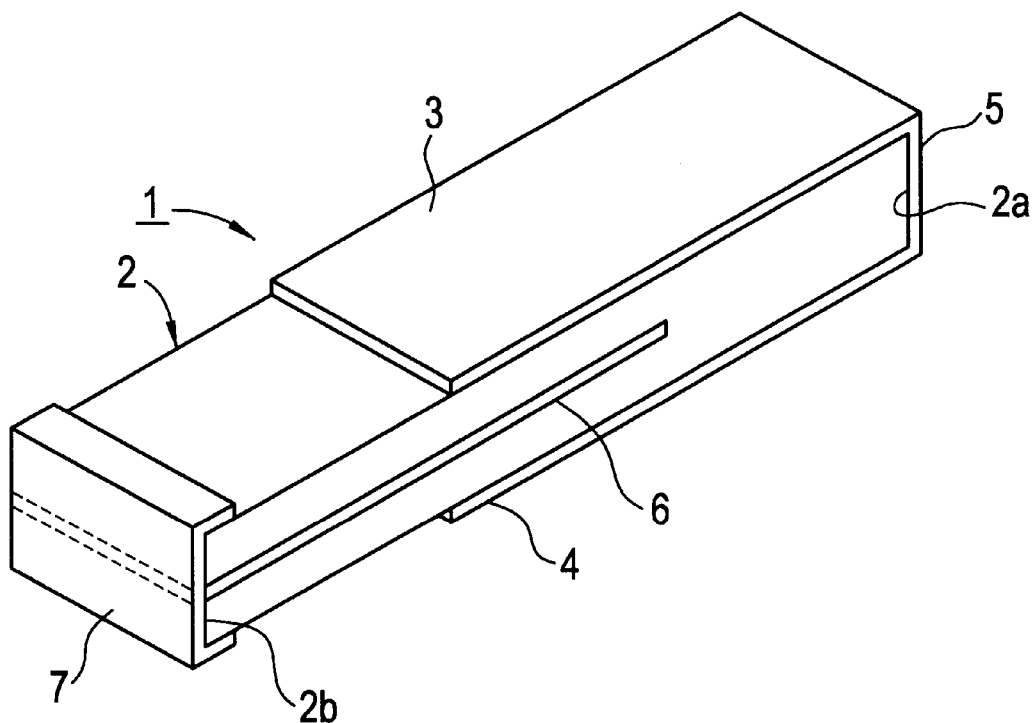
FIG. 1A is a perspective view of a thickness-extensional vibration piezoelectric resonator according to a first preferred embodiment of the present invention.
Figure 1B:
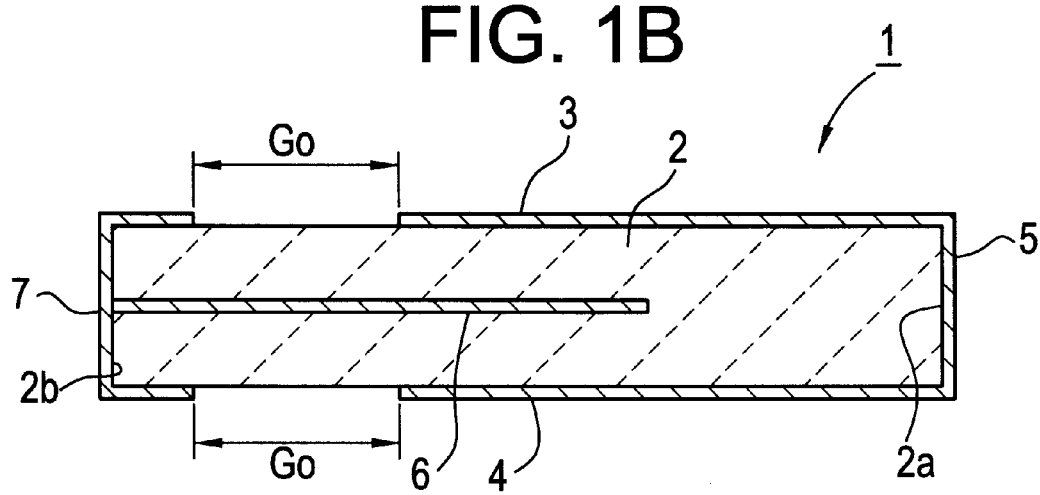
FIG. 1B is a vertical section view of the thickness-extensional piezoelectric resonator of FIG. 1A.

FIGS. 1A and 1B are a perspective view and a longitudinal section of a thickness extensional piezoelectric resonator according to a first preferred embodiment of the present invention.

The thickness extensional vibration piezoelectric resonator 1 preferably includes an elongated strip-shaped piezoelectric body 2. The piezoelectric body 2 is preferably made of a piezoelectric ceramic such as a lead titanate type ceramic and a lead titanate zirconate type ceramic, and is evenly polarized in the thickness direction.

A first excitation electrode 3 is provided on the upper surface of the piezoelectric body 2, while a second excitation electrode 4 on the lower surface thereof. The excitation electrodes 3 and 4 are extended on the upper surface and the lower surface of the piezoelectric body 2 from one 2a of the end surfaces of the piezoelectric body 2 toward the other end surface 2b thereof, respectively. The excitation electrodes 3 and 4 are preferably connected in common to a connecting electrode 5 provided on the end surface 2a of the piezoelectric body 2.

An internal electrode 6 is provided inside of the piezoelectric body 2. The internal electrode 6 extends from the end surface 2b of the piezoelectric body 2, and is preferably electrically connected to a terminal electrode 7 formed on the end surface 2b.

During operation, the second harmonic in a thickness extensional vibration mode is intensely excited by application of an AC voltage between the first and second excitation electrodes 3 and 4 and the internal electrode 6. Thus, the thickness extensional vibration piezoelectric resonator 1 can be operated to use the second harmonic.

In this first preferred embodiment, the first and second excitation electrodes 3 and 4 and the internal electrode 6 are arranged so that they overlap through the piezoelectric layers in the center in the longitudinal direction of the piezoelectric body 2. Accordingly, the locations where the first and second excitation electrodes 3 and 4 and the internal electrode 6 overlap defines an energy-trapping resonance portion. The energy when the resonance portion is vibrated is attenuated in the piezoelectric body portions that are on the opposite sides of the resonance portion.

The first and second excitation electrodes 3 and 4, and the internal electrode 6 are arranged to extend over the entire width of the piezoelectric body 2 only at the resonance portion, and do not need to be formed so as to have the same width in the dielectric body 2 outside of the resonance portion. For example, the excitation electrode 3 portion that is located on the end surface 2a side of the resonance portion may have a smaller width, since this excitation electrode 3 portion is used simply for electrical connection of the excitation electrode 3 to the connecting electrode 5.

Also in this preferred embodiment, the vibration attenuating portions are provided on opposite sides of the resonance portion only in the longitudinal direction of the piezoelectric body 2. No vibration attenuating portion is provided in the width direction of the piezoelectric body 2. Accordingly, the size of the thickness extensional vibration piezoelectric resonator 1 is greatly reduced, and miniaturization of the piezoelectric resonator can be achieved.

In addition, the thickness extensional vibration piezoelectric resonator of this preferred embodiment has the structure in which the first and second excitation electrodes 3 and 4, and the internal electrodes 6 are laminated through the piezoelectric body layers. Accordingly, the thickness extensional vibration piezoelectric resonator of this embodiment has a higher electric capacity as compared with a conventional thickness extensional vibration piezoelectric resonator 80 having no internal electrode, and is less vulnerable to floating capacity generated by a circuit board.

The thickness extensional vibration piezoelectric resonator 1 is fixed preferably by bonding the terminal electrodes 5 and 7 to a case substrate or the like through a space for allowing free vibration of the resonance portion thereof. In some cases, it was observed that large spurious components in the frequency range between the resonance and anti-resonance frequencies were caused.

Figure 2:
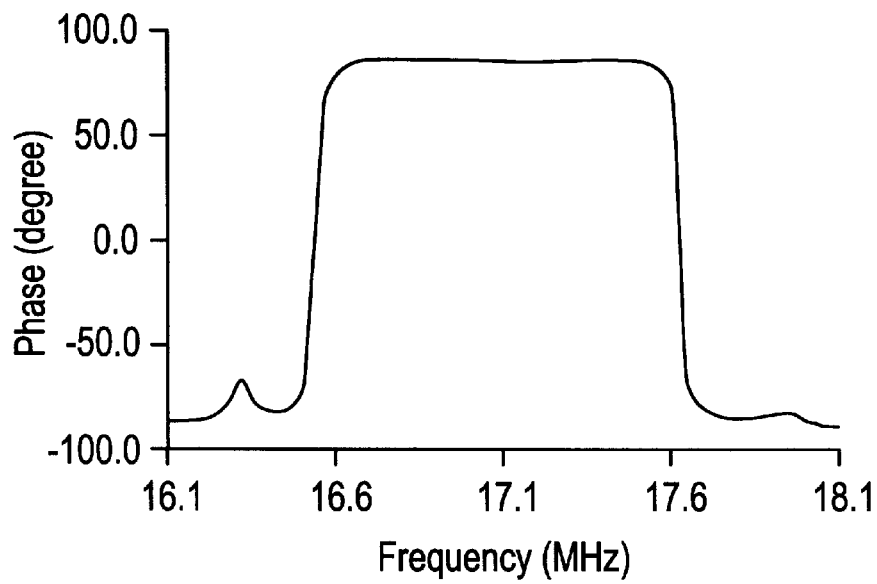
FIG. 2 is a graph showing the phase value-frequency characteristics of the thickness extensional vibration piezoelectric resonator of the first preferred embodiment.
Figure 3:
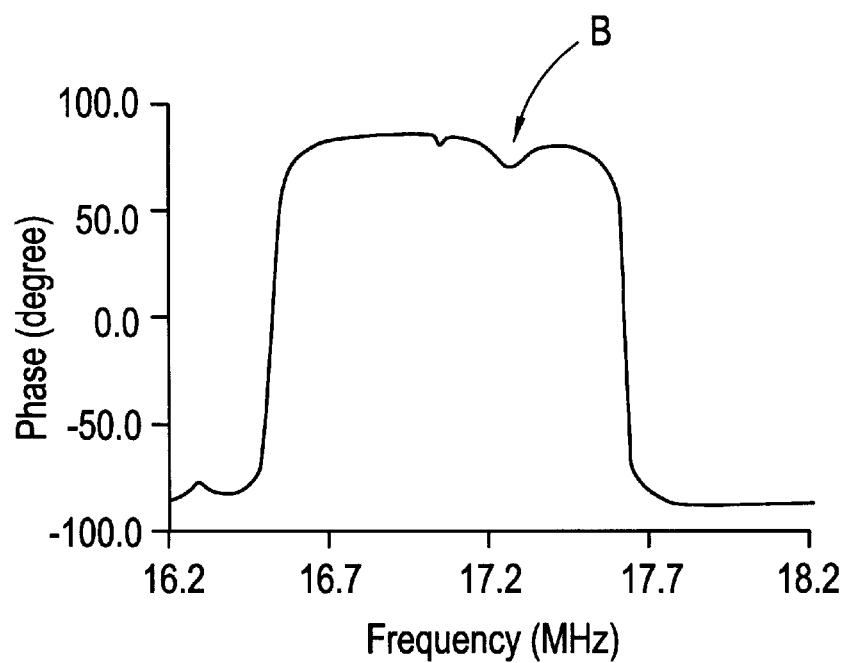
FIG. 3 is a graph showing the phase value-frequency characteristics at a ratio Go/D of about 1.5.

In particular, as shown in the phase-frequency characteristics of FIG. 3, a large spurious component was observed in the frequency range between the resonance and anti-resonance frequencies, as indicated by the arrow B, in some cases. Further, the size of the thickness extensional vibration piezoelectric resonator was varied. There were some cases where the above-mentioned spurious component B was hardly generated. That is, as shown by the phase-frequency characteristics of FIG. 2, no spurious components were exhibited in the frequency range between the resonance and anti-resonance frequencies in some cases.

Accordingly, the differences between the characteristics as shown in FIGS. 2 and 3 were investigated from the various standpoints. As a result, it was discovered that when the distance Go extending in the first direction between the first and second excitation electrodes 3, 4 and the terminal electrode 7 connected to have the opposite potential for the excitation electrodes 3 and 4 is set to a desired value, spurious components can be effectively suppressed, as shown in FIG. 2. Based on this finding, preferred embodiments of the present invention has been developed.

Figure 4:
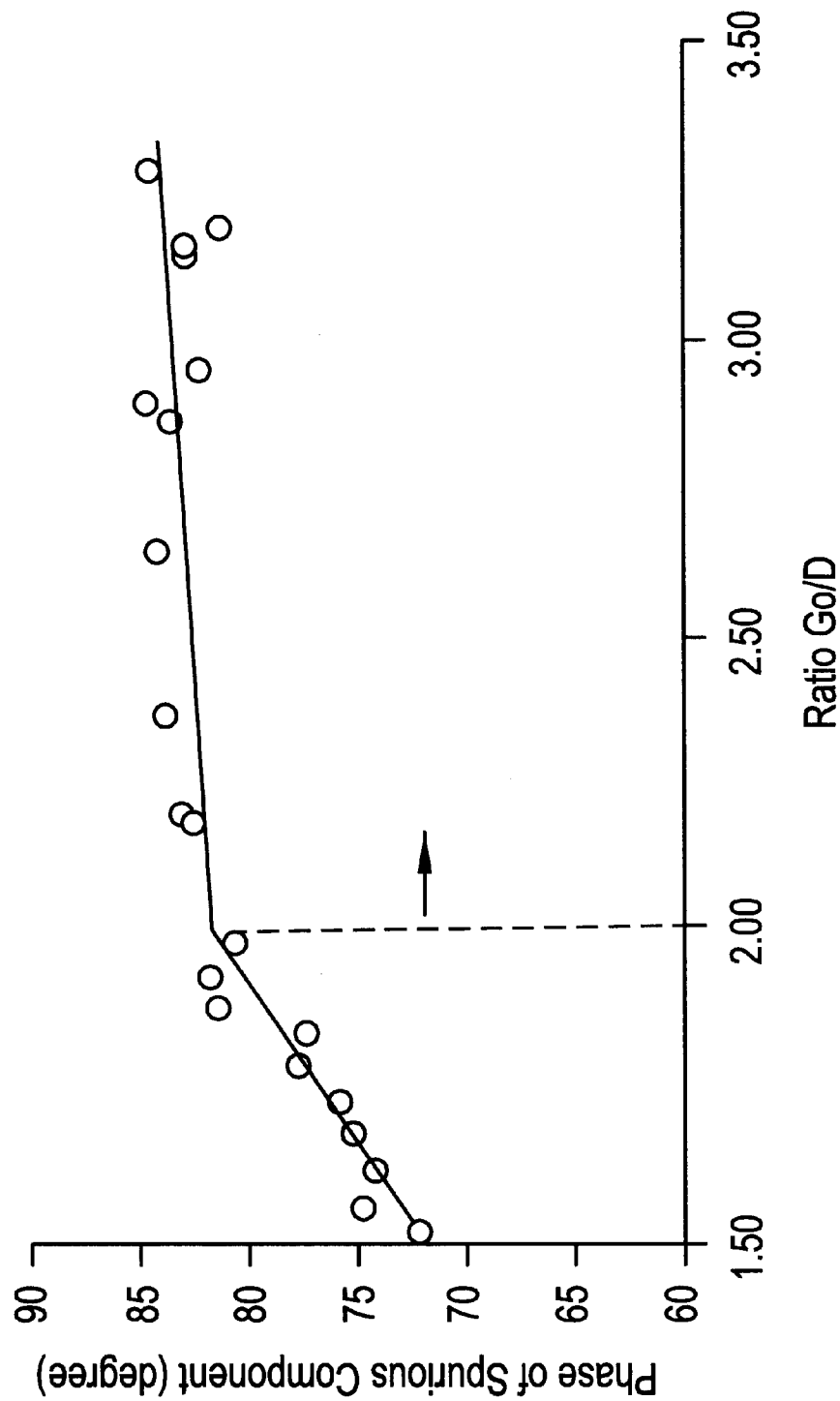
FIG. 4 is a graph showing the change of the minimum phase value of a spurious vibration at different ratios of Go/D.

In particular, when the above-mentioned distance Go is excessively short, some other vibration occurs, due to the electrostrictive effect which is caused by the electric field between the excitation electrodes 3 and 4 and the terminal electrode 7. This causes a large spurious component to appear in the frequency range between the resonance and anti-resonance frequencies. Accordingly, various thickness extensional vibration piezoelectric resonators having different ratios Go/D were prepared. Investigation was conducted of the above-mentioned spurious component between the resonance and anti-resonance frequencies. FIG. 4 shows the results.

In FIG. 4, the ratio Go/D is plotted as abscissa, and the phase value of the spurious component B appearing between the resonance and anti-resonance frequencies is plotted as the abscissa. The phase value is the minimum in the spurious component indicated by the arrow B in FIG. 3.

The experimental piezoelectric body 2 has a size of about 2.0 mm by about 0.4 mm by about 0.3 mm. That is, T equals 0.3 mm, and D equals 0.15 mm. Further, various thickness extensional vibration piezoelectric resonators were prepared at a constant value of D=0.15 mm and different Go values.

As seen in FIG. 4, when the ratio Go/D is less than about 2.0, the minimum phase value of the spurious vibration B appearing between the resonance and anti-resonance frequencies is rapidly reduced. That is, the intensity of the spurious component B is steeply increased. On the other hand, it is shown that when the ratio Go/D is greater than about 2.0, the intensity of the spurious component appearing between the resonance and anti-resonance frequencies is not significantly increased. Accordingly, it is understood that the above-mentioned spurious component appearing between the resonance and anti-resonance frequencies can be suppressed by setting the ratio Go/D to about 2.0 or higher. The upper limit of the ratio Go/D is not restricted from the standpoints of the suppression of the spurious component B. However, for the purpose of the miniaturization of the thickness extensional vibration piezoelectric resonator 1, desirably, the ratio Go/D is set at about 20 or lower.

The phase-frequency characteristics shown in FIG. 2 are at Go/D=2.0. The characteristics of FIG. 3 correspond to those at Go/D=1.5. That is, as seen in FIGS. 2 and 3, unnecessary spurious components appearing between the resonance and anti-resonance frequencies can be effectively suppressed by setting the ratio Go/D at about 2.0 or higher, which results in excellent resonance characteristics.

Figure 5A:
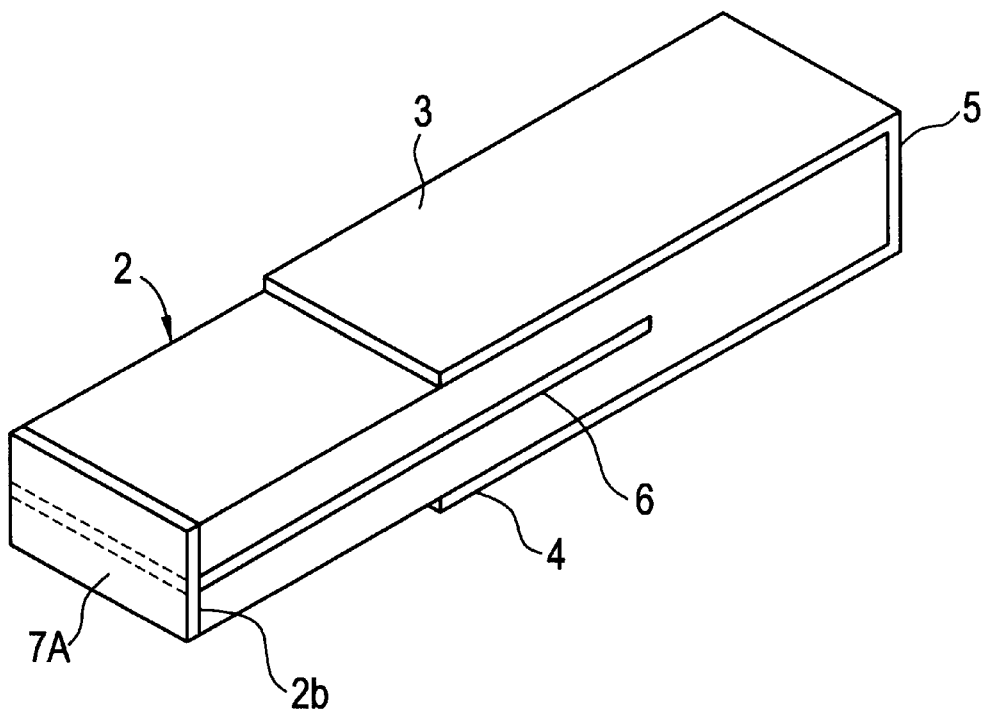
FIG. 5A is a perspective view showing a modification example of the thickness-extensional vibration piezoelectric resonator of the first preferred embodiment.
Figure 5B:
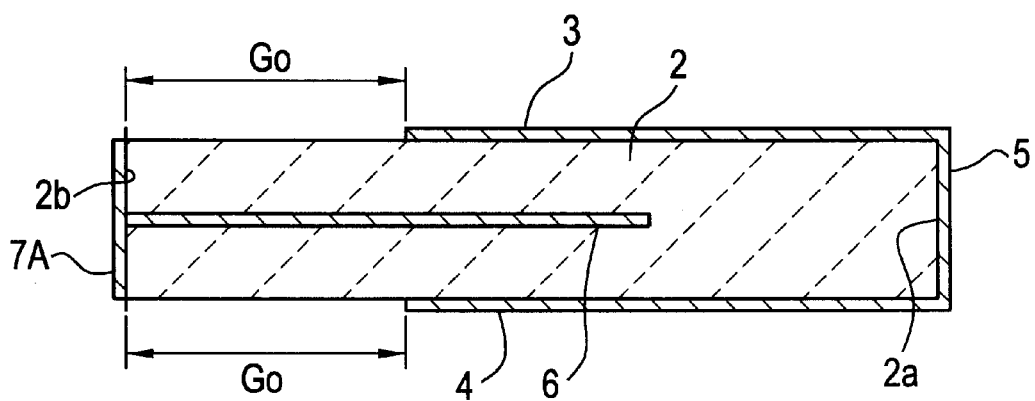
FIG. 5B is a vertical section view of the thickness-extensional piezoelectric resonator of FIG. 5A.

Referring to the distance Go extending in the first direction between the first and second excitation electrodes 3, 4 and the terminal electrode 7 connected so as to have the opposite potential for the excitation electrodes 3 and 4, the terminal electrode 7 is provided so as to extend onto the upper surface and lower surface of the piezoelectric body 2 in the first preferred embodiment, and accordingly, the distance Go is defined as a distance in the first direction between the tip of the terminal electrode 7 and the first or second excitation electrode 3 or 4. However, when a terminal electrode 7A is provided only on the end surface 2b as in a modification example shown in FIGS. 5A and 5B, the distance Go is each of the distances in the first direction between the terminal electrode 7A and the excitation electrodes 3 and 4, in other words, each of the distances in the first direction between the end surface 2b and the excitation electrodes 3 and 4.

Figure 6:
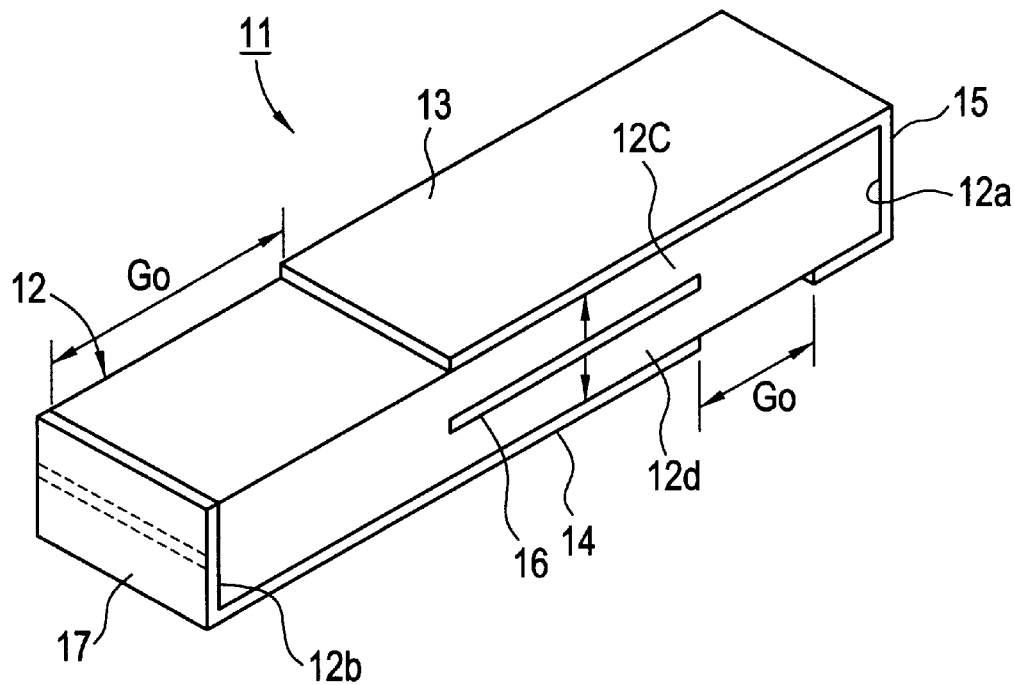
FIG. 6 is a perspective view of a thickness extensional vibration piezoelectric resonator according to a second preferred embodiment of the present invention.

In the thickness extensional vibration piezoelectric resonator 1 of the first preferred embodiment, the piezoelectric body 2 is polarized evenly in the thickness direction, and is a parallel-connection type piezoelectric resonator in which electric fields are applied in the opposite directions to the layers. According to another preferred embodiment, a series connection type piezoelectric resonator may be used that contains a plurality of piezoelectric layers polarized alternately oppositely in the thickness direction. FIG. 6 shows such a preferred embodiment of a series type thickness extensional vibration piezoelectric resonator.

The thickness extensional vibration piezoelectric resonator 11 shown in FIG. 6 preferably includes an elongated, substantially rectangular plate-shaped strip type piezoelectric body 12. A first excitation electrode 13 is provided on the upper surface of the piezoelectric body 12, while a second excitation electrode 14 on the lower surface thereof. The back side of the excitation electrode 13 and the front side of the excitation electrode 14 oppose each other with the piezoelectric body 12 disposed therebetween. Further, the first and second excitation electrodes 13 and 14 are opposed at central portions thereof in the longitudinal direction of the piezoelectric body 12. The resonator portion where the first and second excitation electrodes 13 and 14 are opposed to each other defines an energy-trapping type resonance portion.

In this second preferred embodiment, the first and second excitation electrodes 13 and 14 stem from the end surfaces 12a and 12b of the piezoelectric body 12 to be connected to the terminal electrodes 15 and 17, respectively. Further, the first and second excitation electrodes 13 and 14 may be arranged so as to extend over the entire width of the piezoelectric body 12 besides the resonance portion.

An internal electrode 16 is provided at a substantially central height in the piezoelectric body 12. The internal electrode 16 is arranged in order to polarize the piezoelectric body 12. In particular, a relatively high voltage is applied to the internal electrode 16, while a relatively low voltage applied to the excitation electrodes 13 and 14, so that the piezoelectric layers 12c and 12d are polarized oppositely in the thickness direction, as indicated by the arrows in FIG. 6.

During operation, the second harmonic in a thickness extensional vibration mode can be excited by applying an AC voltage between the first and second excitation electrodes 13 and 14, without using the internal electrode 16.

Also in the thickness extensional vibration piezoelectric resonator 11 of the second preferred embodiment, the vibration-attenuating portions are provided only on two opposite sides of the resonance portion in the longitudinal direction of the piezoelectric body 12. Thus, as in the thickness extensional vibration piezoelectric resonator 1 of the first preferred embodiment, a miniature thickness extensional vibration piezoelectric resonator is provided. Further, since the thickness extensional vibration piezoelectric resonator 11 contains the internal electrode 16, and the excitation electrodes 13 and 14 are arranged so as to extend to both of the side edges in the width direction of piezoelectric body 12, the electric capacity is greatly increased. Accordingly, the thickness extensional vibration piezoelectric resonator 11 is much less vulnerable to influences from a floating capacity generated on a circuit substrate.

In the thickness extensional vibration piezoelectric resonator 11 of the second preferred embodiment, the ratio Go/D is set at about 2.0 or higher, in which Go represents each of the distance between the first and second excitation electrodes 13 and 14, and the terminal electrodes 17 and 15 connected to the opposite electrodes for the first and second excitation electrodes 13 and 14, respectively.

Figure 7:
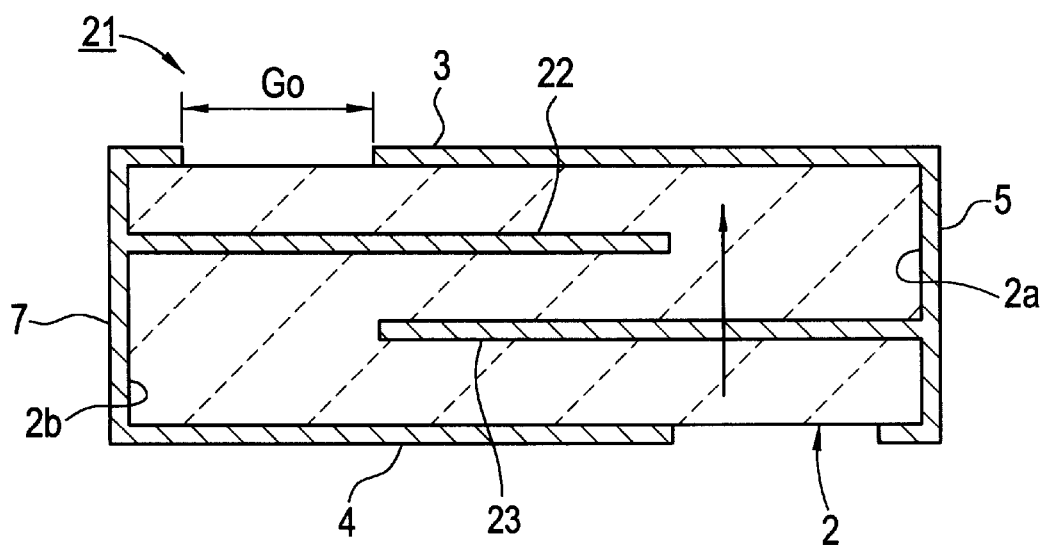
FIG. 7 is a longitudinal section showing a modification example of the thickness extensional vibration piezoelectric resonator according to the preferred embodiments of the present invention.

In the first and second preferred embodiments, the thickness extensional vibration piezoelectric resonators 1 and 11 operate to use the second harmonic in a thickness extensional vibration mode are provided. However, the piezoelectric resonator according to preferred embodiments of the present invention may also be operative to use higher harmonics. FIGS. 7 through 9 are cross-sections illustrating the piezoelectric resonators operative to utilize the higher harmonics other than the second harmonic, and are views corresponding to FIG. 1B illustrating the first preferred embodiment.

FIG. 7 shows a parallel connection type thickness extensional vibration resonator 21 operative to utilize the third harmonic in a thickness extensional vibration mode. In particular, two plate internal electrodes 22 and 23 are provided inside of the piezoelectric body 2. The piezoelectric resonator 21 operative to utilize the third harmonic in a thickness extensional vibration mode is provided by polarizing the piezoelectric body 2 evenly in the thickness direction as indicated by the arrow.

Figure 8A:
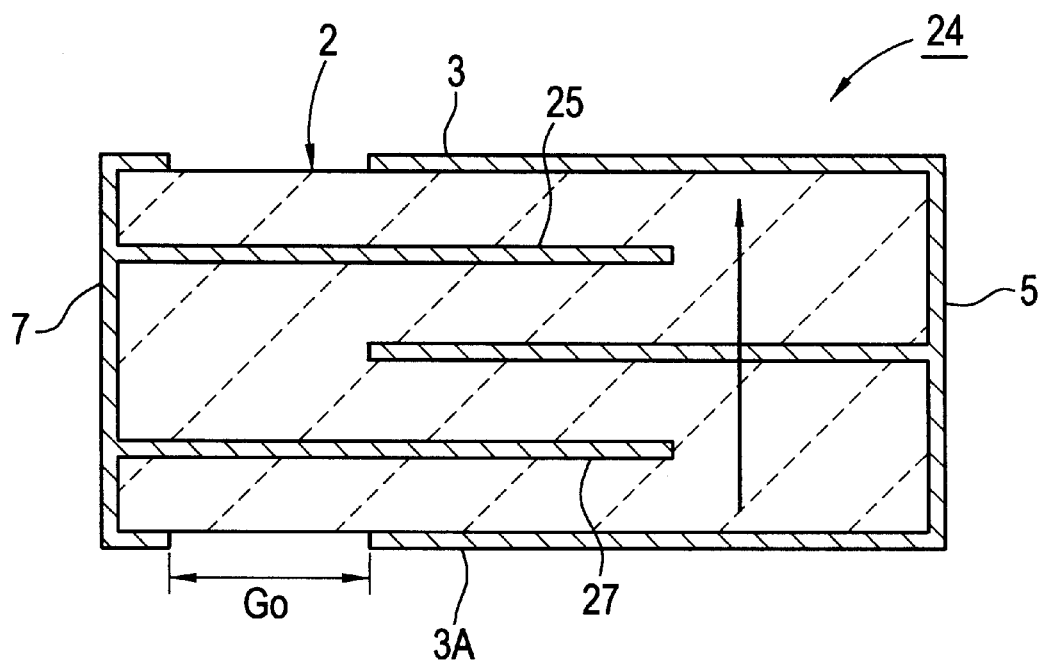
FIGS. 8A and 8B are vertical section views of further preferred embodiments of the thickness extensional vibration piezoelectric resonator according to the present invention.
Figure 9:
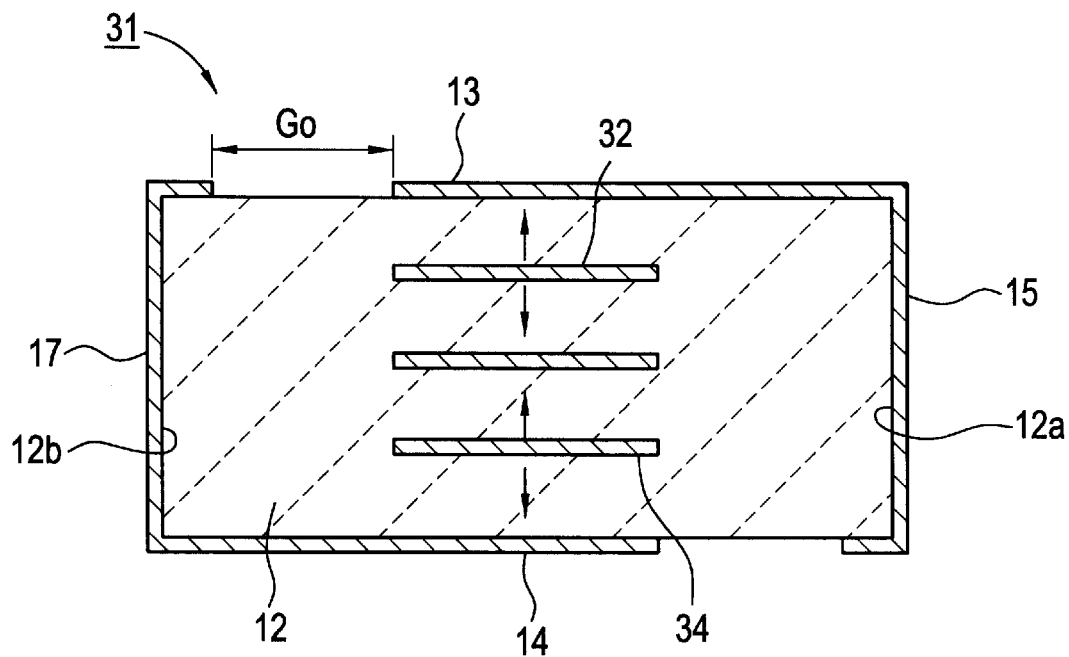
FIG. 9 is a vertical section showing a still further modification example of the thickness extensional vibration piezoelectric resonator according to the preferred embodiments of the present invention.

A thickness extensional vibration piezoelectric resonator 24 shown in the cross-section of FIG. 8A is a parallel connection type piezoelectric resonator 24 operative to use the fourth harmonic in a thickness extensional vibration mode. In the thickness extensional vibration piezoelectric resonator 24, the piezoelectric body 2 is polarized evenly in the thickness direction. Three plate internal electrodes 25 through 27 are provided at a substantially equal distances in the thickness direction inside of the piezoelectric body 2. An excitation electrode 3A is provided on the lower surface of the piezoelectric body 2, and connected to a terminal electrode 5. Accordingly, the fourth harmonic in a thickness extensional vibration mode can be effectively excited.

Figure 8B:
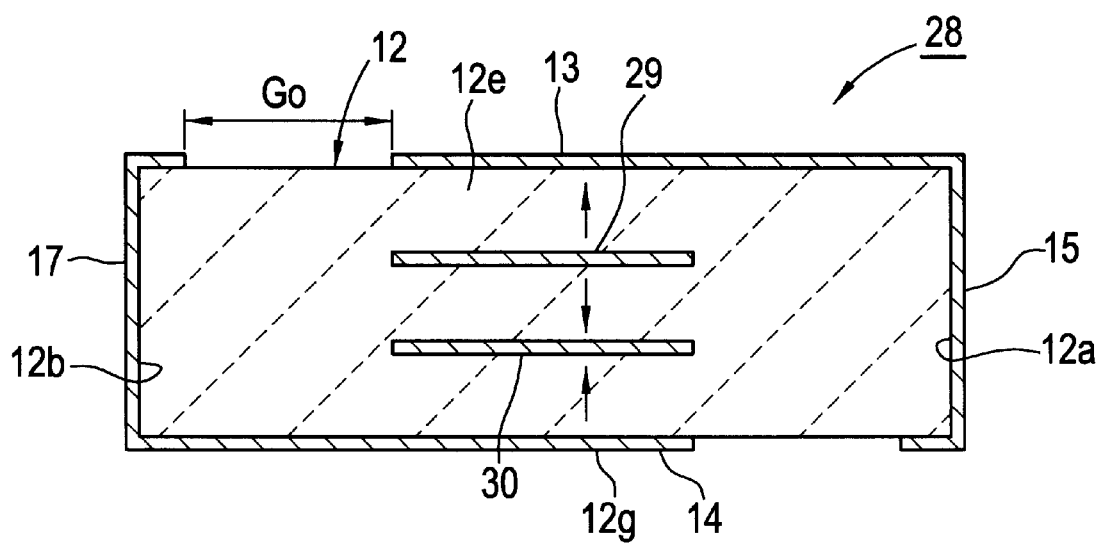

FIG. 8B is a cross-section of a series connection type thickness extensional vibration resonator 28 operative to utilize the third harmonic in a thickness extensional vibration mode. In the thickness extensional vibration resonator 28, two plate internal electrodes 29 and 30 are provided in the piezoelectric body 12, and the inside of the piezoelectric body 12 is divided into three piezoelectric body layers 12e through 12g. Adjacent piezoelectric layers in the piezoelectric body 12 are polarized oppositely in the thickness direction by polarization treatment using these internal electrodes 29 and 30. Accordingly, the third harmonic in a thickness extensional vibration mode can be excited by applying an AC voltage to the first and second excitation electrodes 13 and 14.

Similarly, FIG. 9 is a cross-section of a series connection type piezoelectric resonator 31 operative to utilize the fourth harmonic in a thickness extensional vibration mode. In this case, three plate internal electrodes 32 through 34 are provided in the piezoelectric body 12. The piezoelectric body 12 is polarized by use of these internal electrodes 32 through 34, so that adjacent piezoelectric layers in the piezoelectric body 12 are polarized oppositely to each other in the thickness direction, as shown in FIG. 9.

In the respective thickness extensional vibration piezoelectric resonators as shown in FIGS. 7 through 9, the vibration attenuating portions are provided only on two opposite sides of the resonance portion. Accordingly, a miniature thickness extensional vibration piezoelectric resonator is provided. Since the thickness extensional vibration piezoelectric resonators contains at least one internal electrode, the electric capacity is increased, and the resonator less vulnerable to influences from a floating capacity generated from the circuit board.

Further, in the respective thickness extensional vibration piezoelectric resonators as shown in FIGS. 7 through 9, unnecessary spurious variations appearing between the resonance and anti-resonance frequencies are minimized and effectively suppressed if the above-described ratio Go/D is set at about 2.0 or higher.

Figure 10:
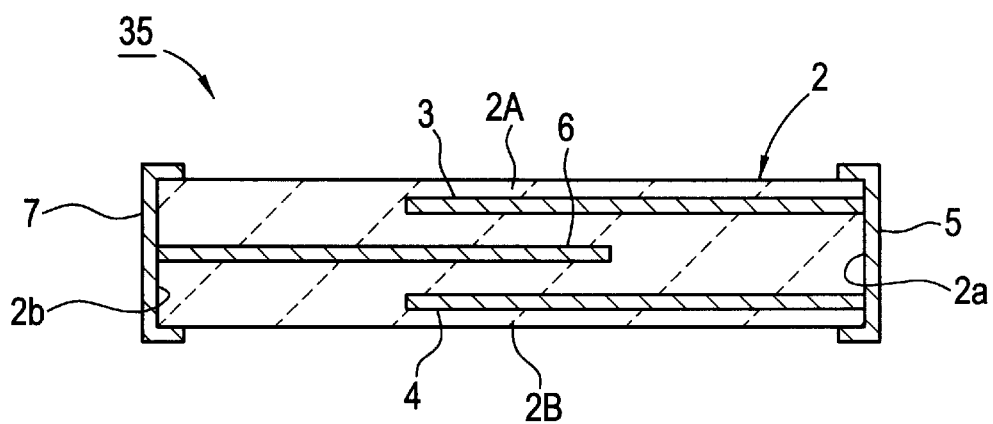
FIG. 10 is a vertical section showing another modification example of the thickness extensional vibration piezoelectric resonator according to the preferred embodiments of the present invention.

In the thickness extensional vibration piezoelectric resonator 35 shown in FIG. 10, piezoelectric layers 2A and 2B are laminated to the outsides of the first and second excitation electrodes 3 and 4, respectively. That is, the thickness extensional vibration piezoelectric resonator 35 is a modification example of the thickness extensional vibration piezoelectric resonator 1 as shown in FIGS. 1A and 1B. In this case, the first and second excitation electrodes 3 and 4 are provided in the form of an internal electrode, due to the formation of the piezoelectric layers 2A and 2B.

Further, the terminal electrodes 5 and 7 are arranged on the end surfaces 2a and 2b of the piezoelectric body 2 and further onto the upper surface and lower surface of the laminate formed by lamination of the piezoelectric body layers 2A and 2B to the piezoelectric body 2, respectively.

In other respects, the thickness extensional vibration piezoelectric resonator 35 is configured in the same manner as the thickness extensional vibration piezoelectric resonator 1. It is noted that when the thicknesses of the piezoelectric layers 2A and 2B are excessively large, the vibration efficiency is reduced. On the other hand, when the thicknesses of the piezoelectric layers 2A and 2B are relatively small, the vibration efficiency is not significantly reduced.

In addition, when the first, second excitation electrodes 3 and 4 are arranged as an internal electrode, the piezoelectric body 2, the piezoelectric layers 2A and 2B, the internal electrode 6, and the excitation electrodes 3 and 4 is provided by the well-known lamination ceramic integration firing technology. Accordingly, the excitation electrodes 3 and 4 can be formed by screen-printing conductive paste before firing, which enables the excitation electrodes 3 and 4 to be formed with very high precision, and the production process is greatly simplified.

Figure 11:
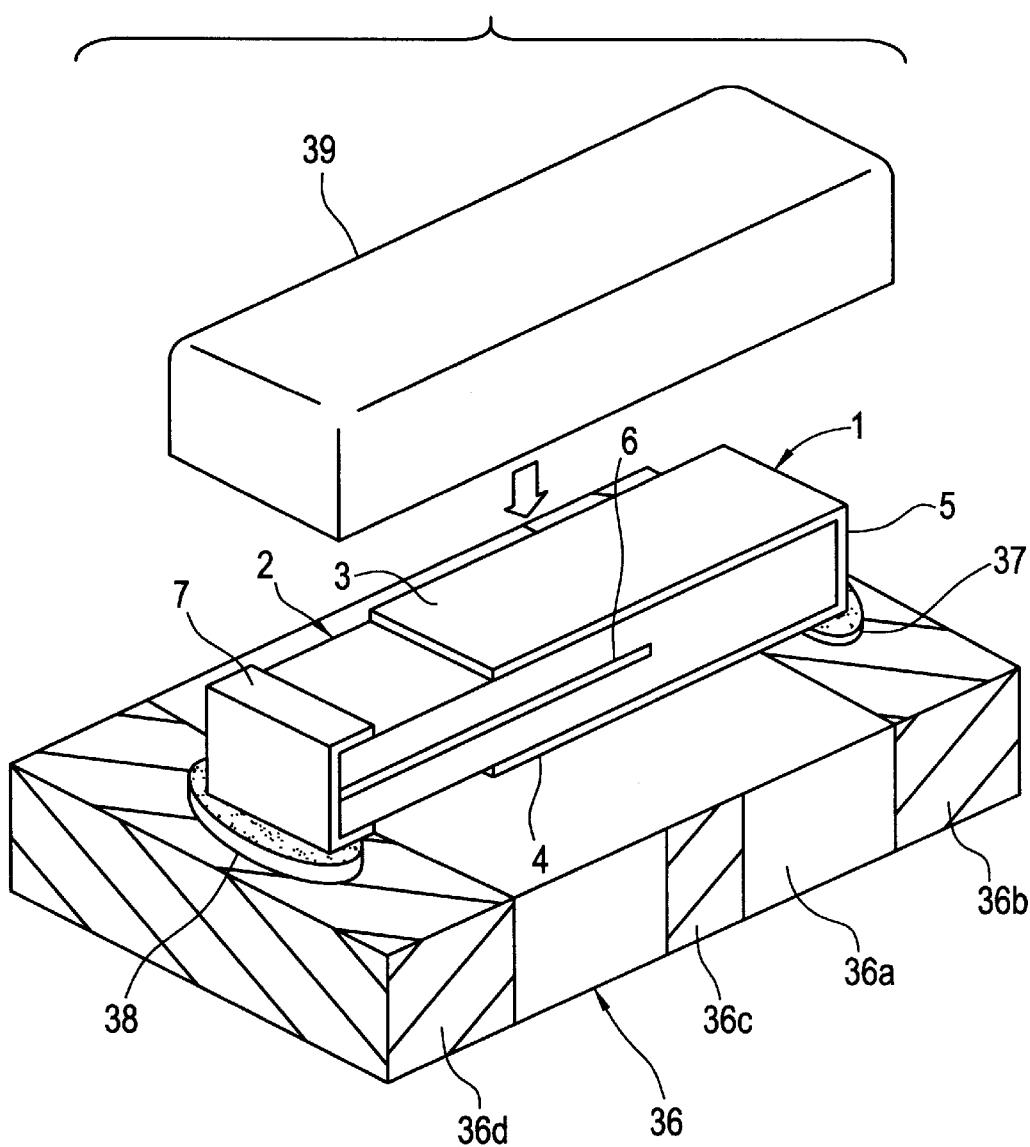
FIG. 11 is an exploded perspective view showing a piezoelectric resonance device according to a third preferred embodiment of the present invention.

FIG. 11 is an exploded perspective view illustrating a chip type piezoelectric resonance device according to another preferred embodiment of the present invention. In the chip type piezoelectric resonance device of this preferred embodiment, the thickness extensional vibration piezoelectric resonator 1 as shown in FIG. 1 is bonded to a capacitor substrate 36 through conductive adhesives 37 and 38. The capacitor substrate 36 contains a rectangular dielectric substrate 36a made of a dielectric material such as dielectric ceramics or the like, and plural electrodes 36b through 36d provided on the outside of the dielectric substrate 36a. In the capacitor substrate 36, capacitors are arranged between the electrodes 36b and 36d, and the electrode 36c.

Further, the thickness extensional vibration piezoelectric resonator 1 is bonded to the capacitor substrate 36 with extra space for allowing for free and unhindered vibration of the resonator. This is achieved by bonding the terminal electrodes 5 and 7 to the electrodes 36b and 36d with the conductive adhesives 37 and 38, respectively.

Figure 12:
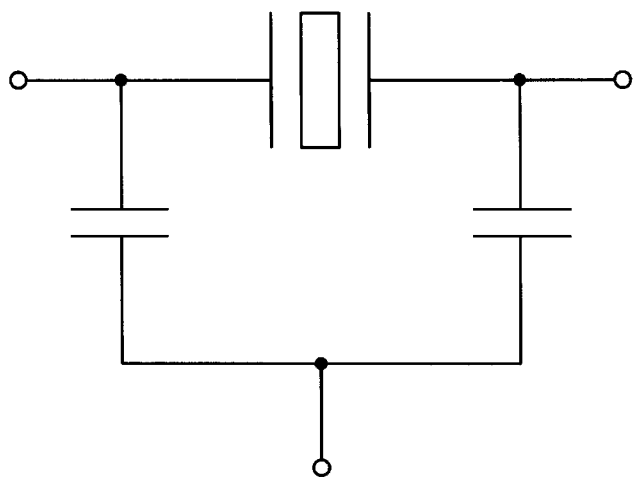
FIG. 12 is a circuit diagram showing the circuit configuration of the preferred embodiment of the piezoelectric resonance device shown in FIG. 11.

As shown in FIG. 12, this piezoelectric resonance device is a circuit containing a resonator and two capacitors between the electrodes 36b, 36c, and 36d. Thus, a load-capacity containing type piezoelectric oscillator can be provided in the form of a single device.

Finally, a cap 39 defining a casing member is preferably bonded to the capacitor substrate 36 with an insulating adhesive so as to cover the thickness extensional vibration piezoelectric resonator 1.

In the piezoelectric resonance device according to preferred embodiments of the present invention, the substrate and casing member are not limited to the above-mentioned capacitor substrate 36 and the cap 39, respectively. That is, as the substrate, a container body having an opening on the upper side thereof may be prepared. In the container body, the thickness extensional vibration piezoelectric resonator 1 is placed, and then a lid to close the container body, as the casing member, is bonded to the substrate.

Figure 13A:
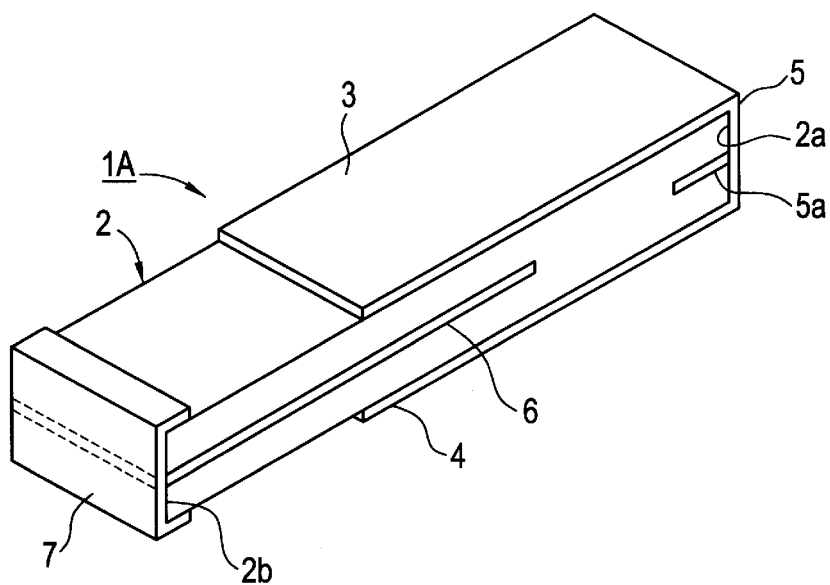
FIG. 13A is a perspective view showing a thickness extensional vibration piezoelectric resonator according to a fourth preferred embodiment of the present invention.
Figure 13B:
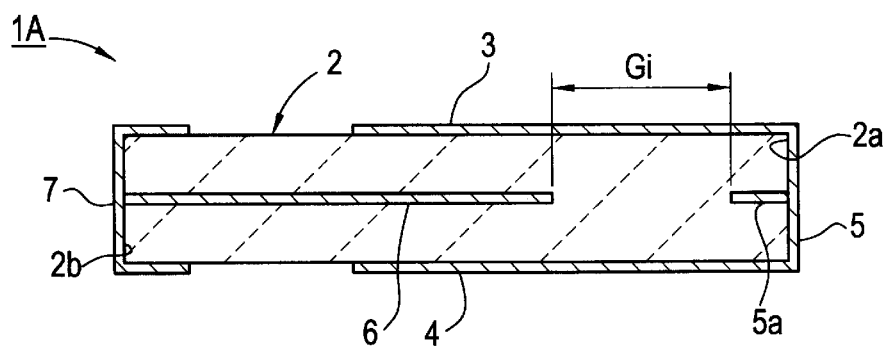
FIG. 13B is a vertical section view of the thickness extensional piezoelectric resonator of FIG. 13A.

FIGS. 13A and 13B are a perspective view and a longitudinal section illustrating a thickness extensional vibration piezoelectric resonator according to a fourth preferred embodiment of the present invention.

The thickness extensional vibration piezoelectric resonator 1A of the fourth preferred embodiment is constituted in the same manner as the thickness extensional vibration piezoelectric resonator 1 of the first preferred embodiment except that an inward protuberance 5a, approximately positioned at the same height as the internal electrode 6, is electrically connected to the terminal electrode 5, and the ratio Gi/D, instead of the ratio Go/D, is set at about 2.0 or higher. The description of the other structure of the thickness extensional vibration piezoelectric resonator 1A will be omitted since it is similar to that described with respect to the first preferred embodiment.

As previously mentioned, the thickness extensional vibration piezoelectric resonator 1 of the first preferred embodiment, unnecessary spurious vibrations appearing between the resonance and anti-resonance frequencies are suppressed by setting the ratio Go/D at about 2.0 or higher in which Go represents each of the distances between the first and second excitation electrodes 3 and 4, and the terminal electrodes 7 and 5.

Figure 14:
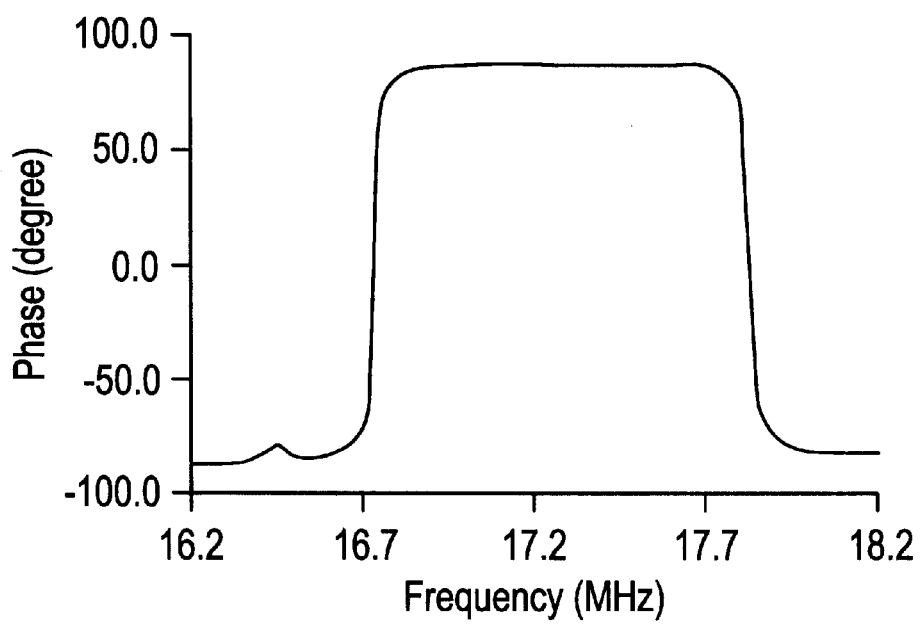
FIG. 14 is a graph showing the phase—frequency characteristics of the thickness extensional vibration piezoelectric resonator of the fourth preferred embodiment of the present invention.
Figure 15:
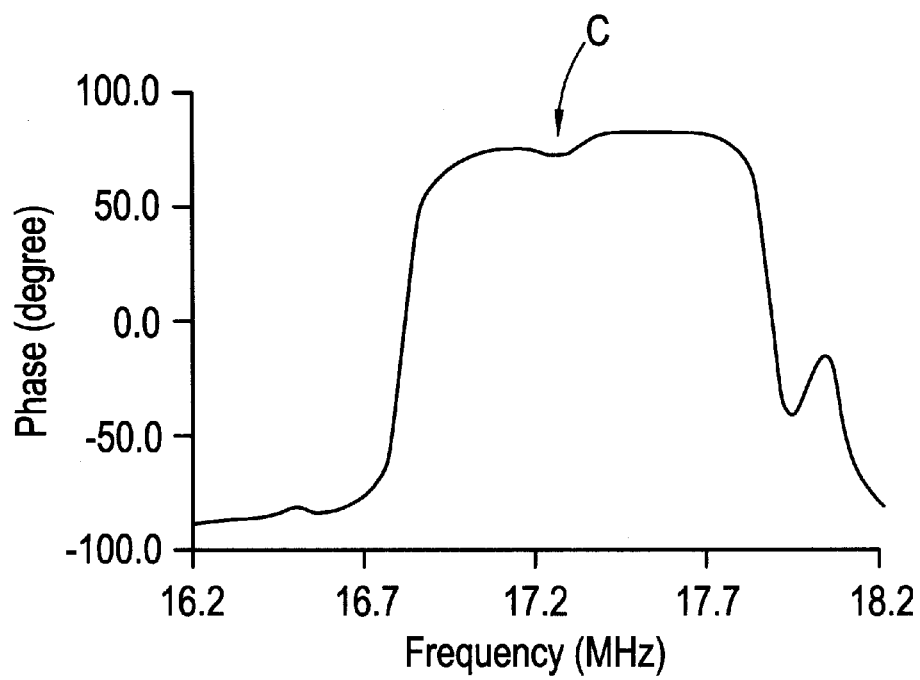
FIG. 15 is a graph showing the phase—frequency characteristics at a ratio Gi/D of about 1.5.
Figure 16:
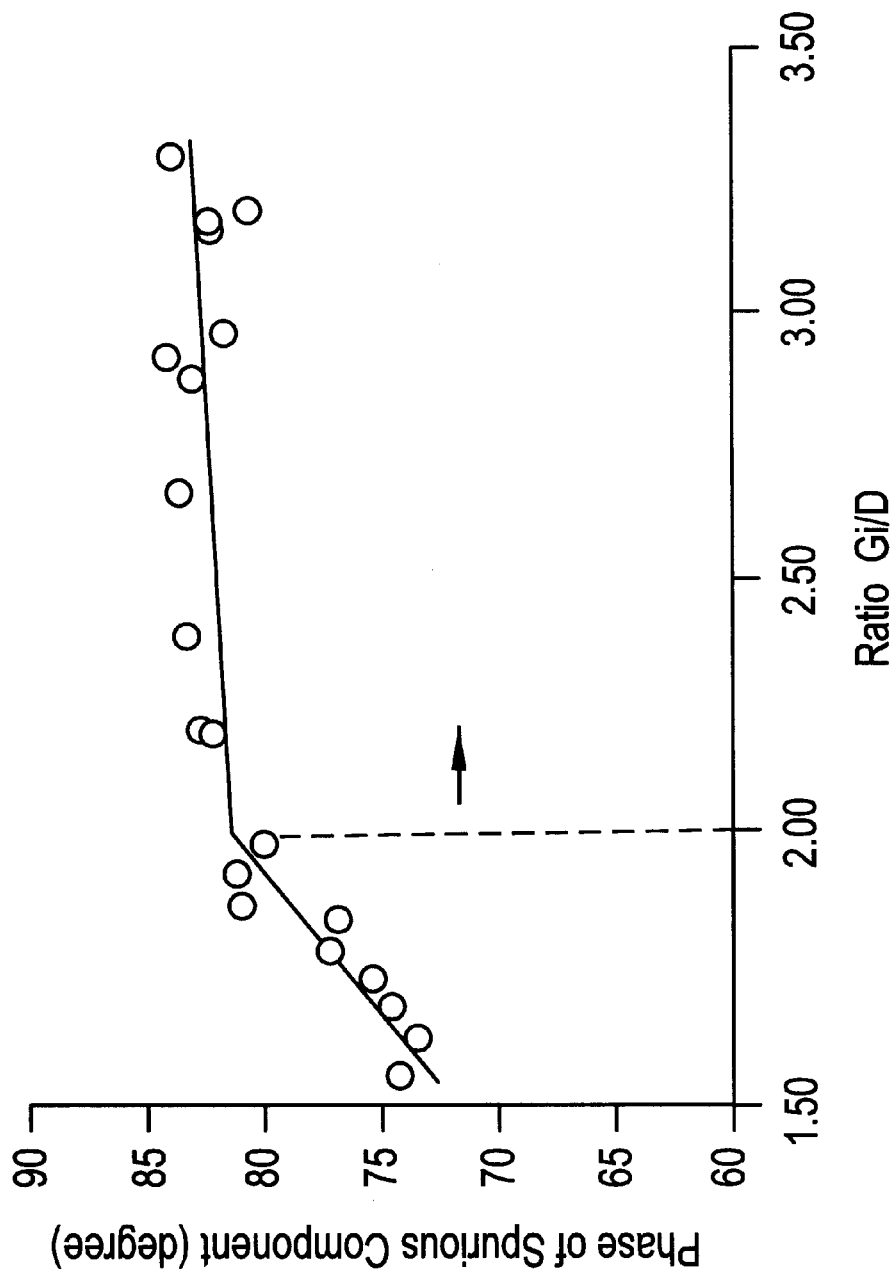
FIG. 16 is a graph showing a relationship between the ratio Gi/D of the thickness extensional vibration piezoelectric resonator of the fourth preferred embodiment and the minimum phase value of a spurious vibration appearing between the resonance and anti-resonance frequencies.

Referring to the distance Gi between the internal electrode 6 defining an internal excitation electrode and the terminal electrode 5 connected to have the opposite potential for the internal electrode 6, the applicants of this invention have discovered that the above-described spurious vibrations are minimized suppressed by adjustment of the ratio Gi/D. In particular, thickness extensional vibration piezoelectric resonators were prepared with the ratio Gi/D being varied. Investigation of the resonance characteristics of the thickness extensional vibration piezoelectric resonators was conducted. FIGS. 14 through 16 show the results.

In the experiment, the piezoelectric body 2 with a size of about 2.0 mm by about 0.4 mm by about 0.3 mm was used. The distance Gi was varied at D=0.3 mm/2=0.15 mm. No significant spurious vibration C between the resonance and anti-resonance frequencies at Gi/D=0.2 were observed, as shown in FIG. 14. On the other hand, as shown in FIG. 15, spurious vibrations between the resonance and anti-resonance frequencies, as indicated by the arrow C, appear at Gi/D=0.15. Further, it is observed that when the ratio Gi/D is less than about 2.0, the spurious vibration C appearing between the resonance and anti-resonance frequencies is increased, as seen in FIG. 16. In FIG. 16, the minimum phase value of the spurious component C is plotted as ordinate. A smaller phase value means a larger spurious component. Accordingly, in the thickness extensional vibration piezoelectric resonator 1A, spurious vibrations appearing between the resonance and anti-resonance frequencies are suppressed by selecting the distance Gi in the first direction between the internal electrode 6 and the tip of the inward protuberance 5a of the terminal electrode 5 so that the ratio Gi/D is at least 2.0.

The upper limit of the ratio Gi/D is not particularly restrictive from the standpoint of the inhibition of the above-described spurious vibration. However, for the purpose of miniaturizing the piezoelectric resonator 1A, it is desirable that the ratio Gi/D is less than about 20.

In the thickness extensional vibration piezoelectric resonator 1A, the inward protuberance 5a is provided on the terminal electrode 5. Accordingly, the distance Gi is the distance in the first direction between the internal electrode 6 and the tip of the inward protuberance 5a. However, the inward protuberance may be omitted.

Figure 17A:
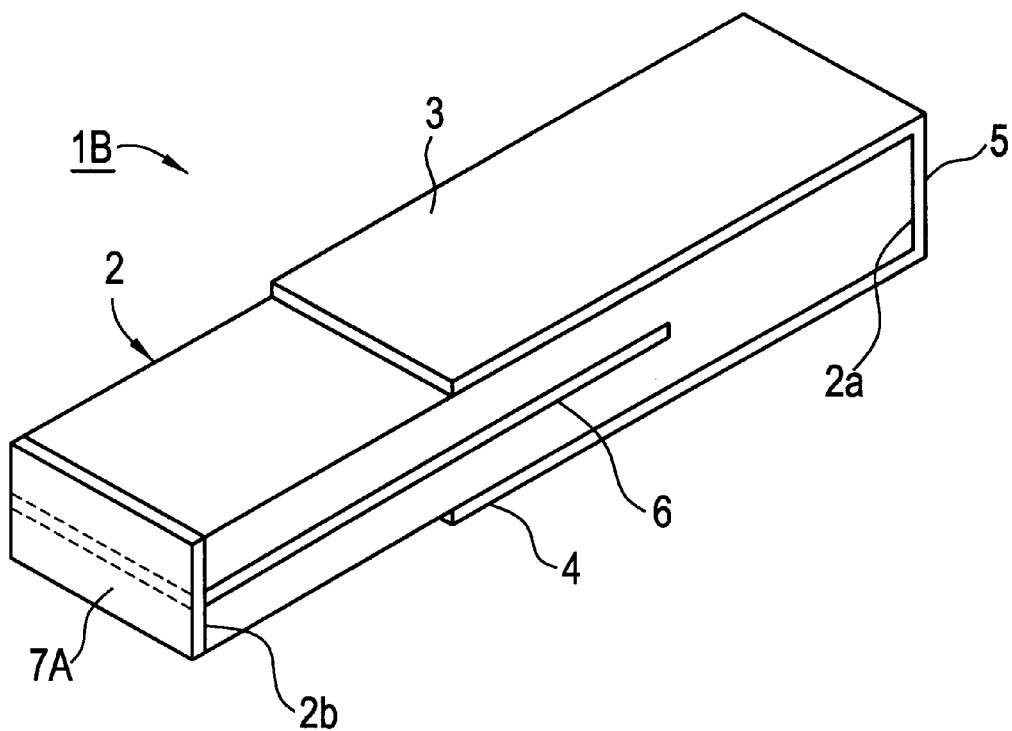
FIG. 17A is a perspective view showing a thickness extensional vibration piezoelectric resonator according to a fifth preferred embodiment of the present invention.
Figure 17B:
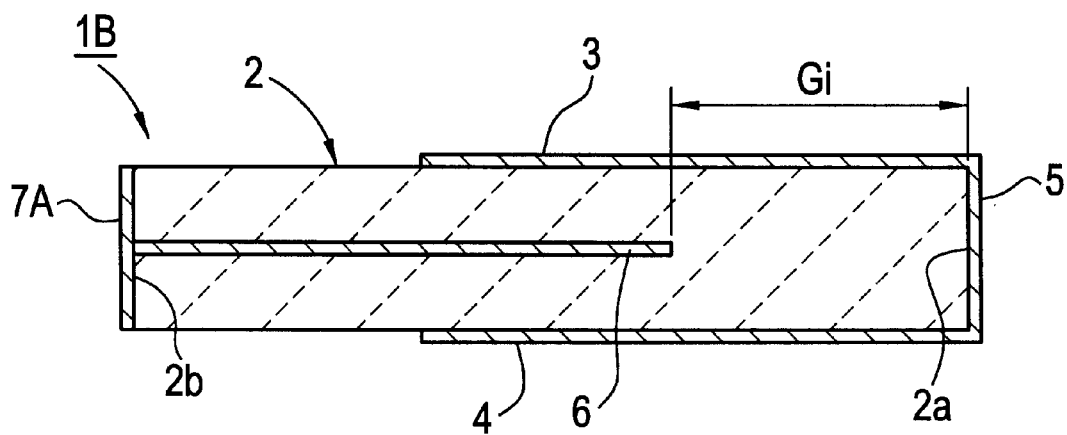
FIG. 17B is a vertical section view of the thickness extensional piezoelectric resonator of FIG. 17A.

In particular, when a thickness extensional vibration piezoelectric resonator 1B is constituted as shown in FIGS. 17A and 17B, the distance Gi is a distance between the internal electrode 6 and the terminal electrode 5. Also in this case, spurious vibrations appearing between the resonance and anti-resonance frequencies can be effectively suppressed by setting the ratio Gi/D at about 2.0 or higher, as in the thickness extensional vibration piezoelectric resonator 1A.

More preferably, the ratio Go/D is preferably set at about 2.0 or higher, so that spurious vibrations appearing between the resonance and anti-resonance frequencies can be suppressed more effectively.

Figure 18:
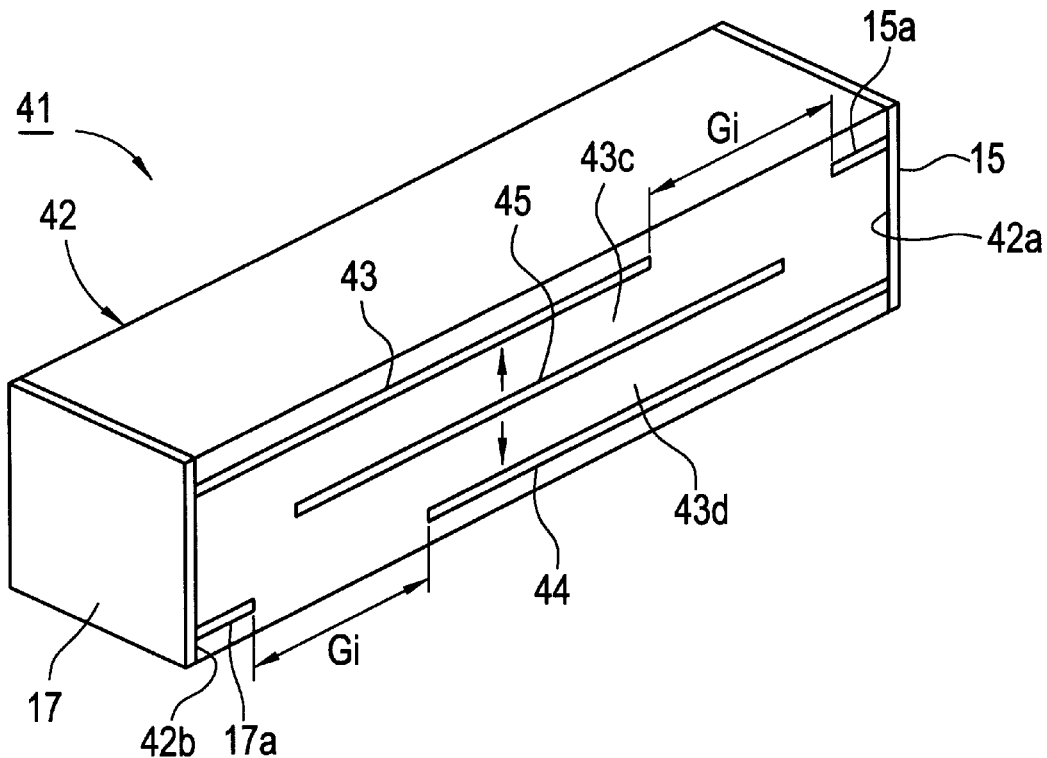
FIG. 18 is a perspective view showing still another modification example of the thickness extensional vibration piezoelectric resonator according to the preferred embodiments of the present invention.

FIG. 18 is a perspective view of a thickness extensional vibration piezoelectric resonator according to a fifth preferred embodiment of the present invention.

The thickness extensional vibration piezoelectric resonator 41 includes an elongated, substantially rectangular plate-shaped strip-type piezoelectric body 42. Internal excitation electrode 43 and 44 are arranged to overlap in the thickness direction in the piezoelectric body 42. Further, an internal electrode 45 used for polarization is provided between the internal excitation electrodes 43 and 44. The internal excitation electrode 43 is extended to one 42b of the end surfaces in the longitudinal direction of the piezoelectric body 42, while the internal excitation electrode 44 is extended to the other end surface 42a of the piezoelectric body 42. The portion where the internal excitation electrodes 43 and 44 are overlapped in the thickness direction through the piezoelectric body 42 constitutes a resonance portion. Thus, also in this preferred embodiment, the energy-trapping type piezoelectric resonator includes vibration attenuating portions arranged on two opposite sides of the resonance portion in the longitudinal direction.

The thickness extensional vibration piezoelectric resonator 41 is a series connection type piezoelectric resonator as described above. The polarized piezoelectric body layer 43c and the piezoelectric body layer 43d provided on the upper side and the lower surface of the internal electrode 45 are polarized oppositely in the thickness direction.

Further, terminal electrodes 15 and 17 are arranged to cover the end surfaces 42a and 42b, respectively. The terminal electrode 15 preferably has an inward protuberance 15a. The inward protuberance 15a is provided opposite to the tip of the internal excitation electrode 43 in the same plane, at the same height where the internal excitation electrode 43 is provided. Similarly, the terminal electrode 17 is preferably provided with an inward protuberance 17a. The inward protuberance 17a is provided to be opposed to the tip of the internal excitation electrode 44 in the same plane, at an interval relative to each other, and at the same height where the internal excitation electrode 44 is provided.

The thickness extensional vibration piezoelectric resonator 41 of this preferred embodiment is a series connection type thickness extensional vibration piezoelectric resonator operative to utilize the second harmonic in a thickness extensional vibration mode. If the ratio Gi/D is set at about 2.0 or higher, spurious vibrations appearing between the resonance and anti-resonance frequencies are effectively suppressed. The distance Gi is defined as the distance between the internal excitation electrode 43 and the inward protuberance 15a in the first direction, or as the distance between the internal excitation electrode 44 and the inward protuberance 17a in the first direction.

Figure 19:
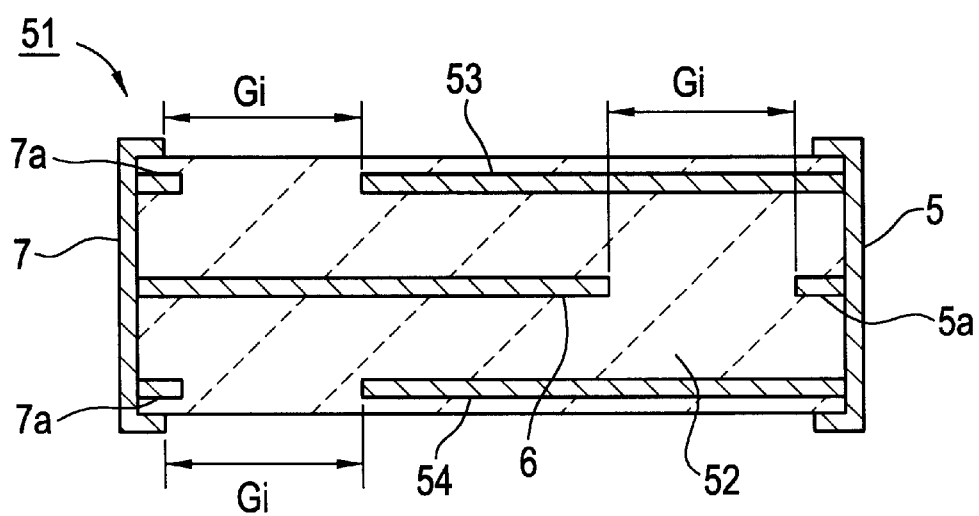
FIG. 19 is a vertical section showing yet another modification example of the thickness extensional vibration piezoelectric resonator according to the preferred embodiments of the present invention.
Figure 20:
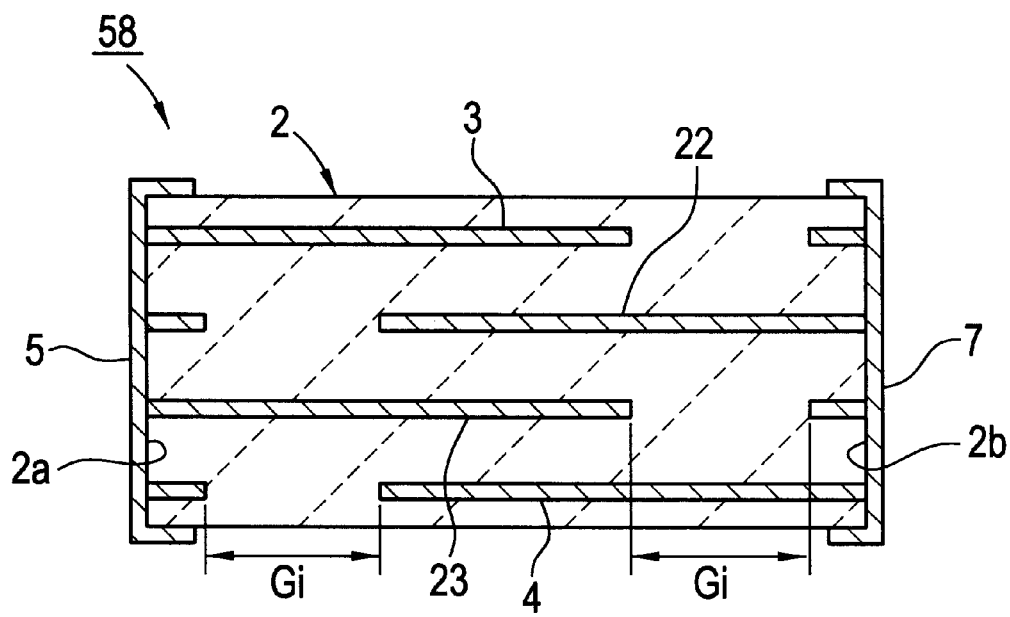
FIG. 20 is a vertical section view of another preferred embodiment of the thickness extensional vibration piezoelectric resonator according to the present invention.
Figure 21:
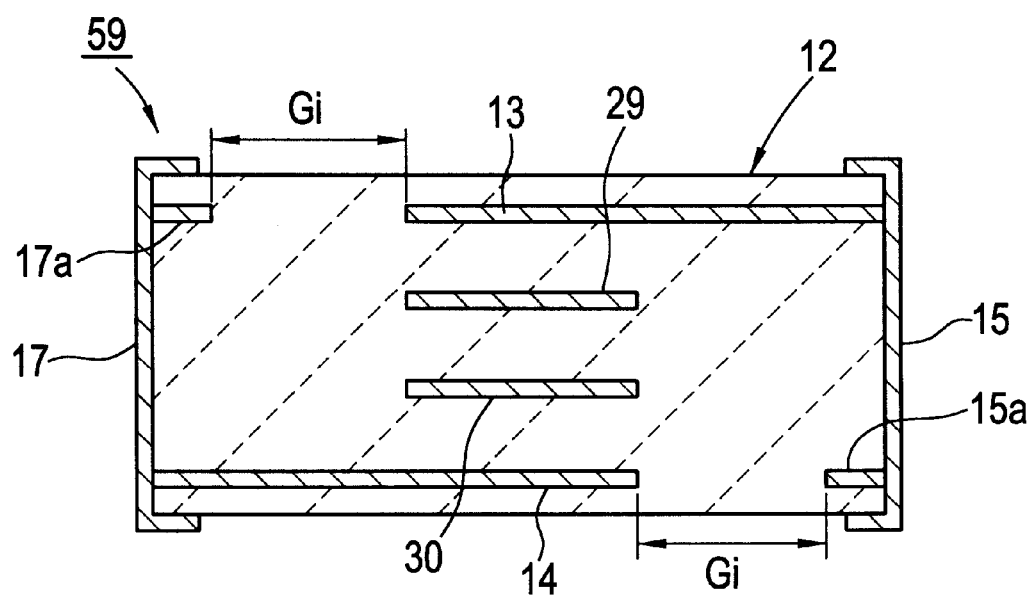
FIG. 21 is a vertical section view of still further modification example of the thickness extensional vibration piezoelectric resonator according to the preferred embodiments of the present invention.
Figure 22:
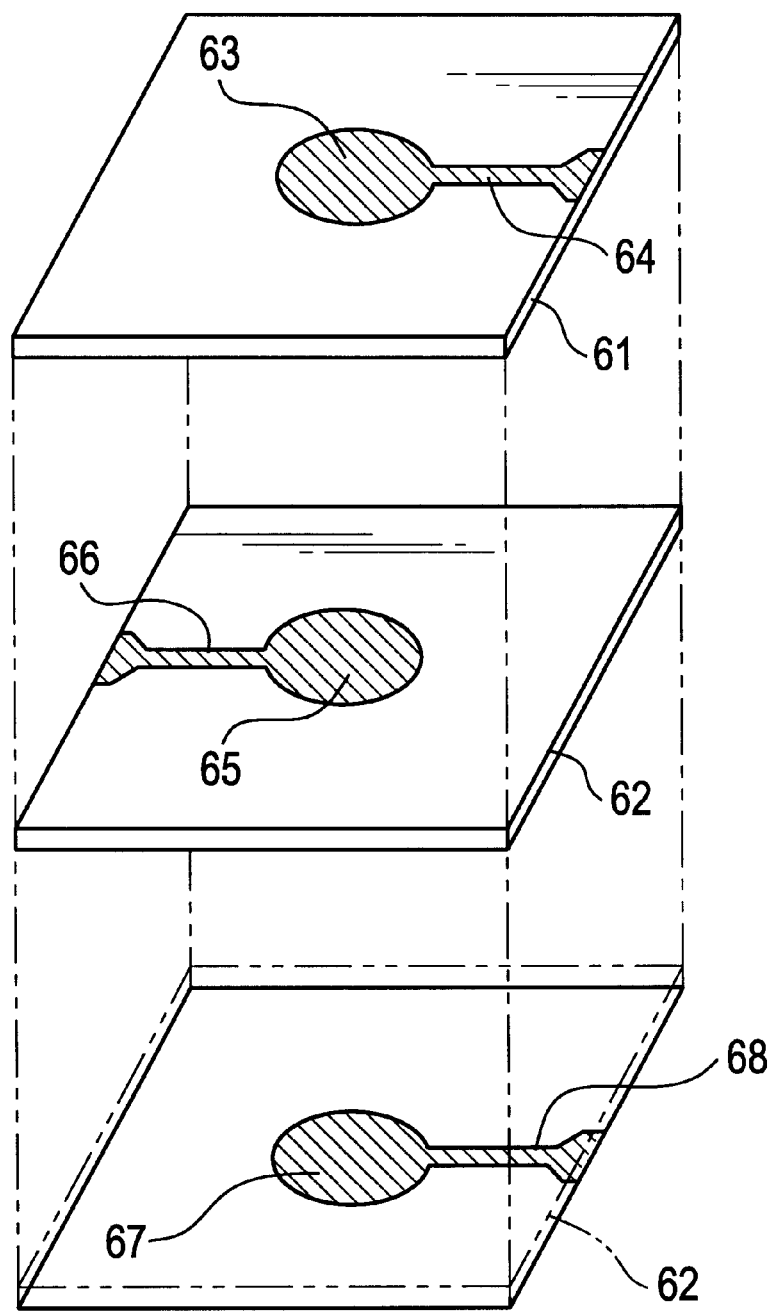
FIG. 22 is an exploded perspective view illustrating an example of conventional thickness extensional piezoelectric resonator.
Figure 23:
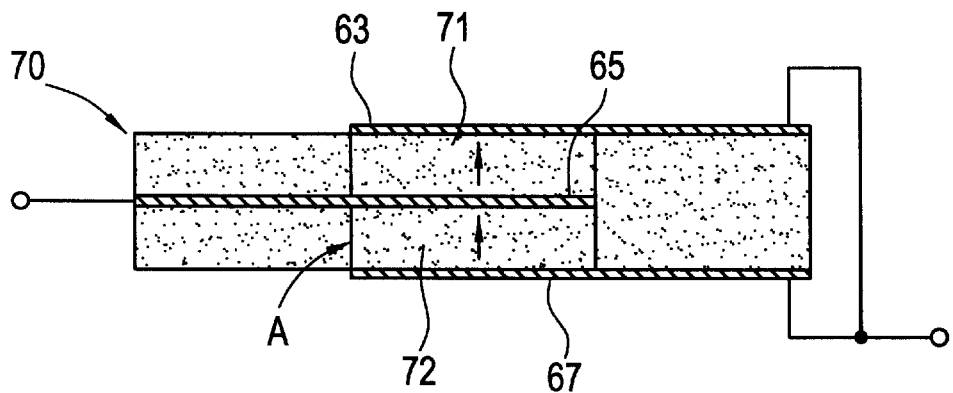
FIG. 23 is a sectional view of the conventional thickness extensional piezoelectric resonator shown in FIG. 22.
Figure 24:
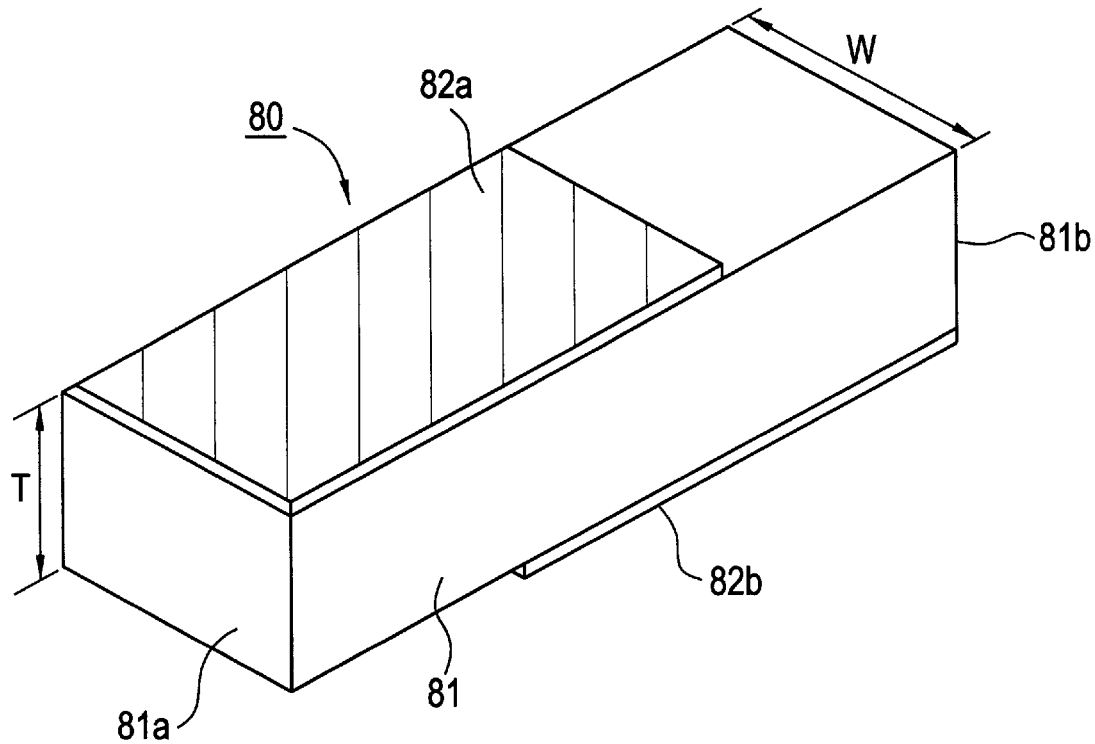
FIG. 24 is a perspective view illustrating another example of conventional thickness extensional piezoelectric resonator.

FIGS. 19 through 21 are longitudinal sections showing other modification examples of the thickness extensional vibration piezoelectric resonator of the present invention.

A thickness extensional vibration piezoelectric resonator 51 as shown in FIG. 19 has a structure that the excitation electrodes 3 and 4 described in the thickness extensional vibration piezoelectric resonator 1 of FIG. 1 are embedded in the piezoelectric body 52 to function as an internal excitation electrode, in which the inward protuberances 5a, and 7a and 7a are provided for the terminal electrodes 5 and 7, respectively.

The internal electrode 6 need not be used for polarization, and is provided as an excitation electrode of FIG. 19. Also in this preferred embodiment, spurious vibrations can be effectively suppressed by setting the ratio Gi/D at about 2.0 or higher in which Gi represents each of the distances between the internal excitation electrodes 6, 53, and 54 and the terminal electrodes 5, 7a, and 7b, respectively.

The thickness extensional vibration piezoelectric resonators of FIGS. 20 and 21 correspond to the modification examples of the thickness extensional vibration piezoelectric resonators of FIGS. 7 and 8B, respectively. However, in each piezoelectric body, the first and second excitation electrodes are embedded as an internal excitation electrode. In addition, the internal excitation electrodes and the inward protuberances 5a and 7a on the terminal electrodes 5 and 7 are connected to have the opposite potentials for the corresponding internal excitation electrodes. Also in the thickness extensional vibration piezoelectric resonators 58 and 59 as shown in FIGS. 20 and 21, the above-described spurious vibrations can be effectively suppressed by setting the ratio Gi/D at about 2.0 or higher in which Gi represents each of the distances between the internal excitation electrodes and the terminal electrodes or the inward protuberances of the terminal electrodes connected to have the opposite potentials, correspondingly.

With the thickness extensional vibration piezoelectric resonators of FIG. 13, and FIGS. 17 through 21, the piezoelectric resonance device of FIG. 11, for example, is provided by use of the substrate and a casing member, as in the thickness extensional vibration piezoelectric resonator of the first preferred embodiment.

While the invention has been particularly shown and described with reference to preferred embodiments thereof, it will be understood by those skilled in the art that the forgoing and other changes in form and details may be made therein without departing from the spirit of the invention.

What is claimed:

1. A piezoelectric resonator comprising:
    a piezoelectric body having a plurality of piezoelectric layers;
    a first excitation electrode disposed on a first outer surface of said piezoelectric body, said first excitation electrode having a width that is substantially equal to the width of said piezoelectric body;
    a second excitation electrode disposed on a second outer surface of said piezoelectric body, wherein said second outer surface is opposite said first outer surface, and wherein said second excitation electrode has a width that is substantially equal to the width of said first excitation electrode;
    an internal electrode disposed inside of the piezoelectric body such that the internal electrode partially overlaps both the first excitation electrode and the second excitation electrode;
    a resonating portion defined by a portion of overlap between the first excitation electrode, the second excitation electrode, and the internal electrode;
    a plurality of vibration-attenuation portions disposed at two opposite sides of said resonating portion, wherein said plurality of vibration-attenuation portions are arranged to vibrate in an N-order harmonic mode;
    a terminal electrode disposed on a third outer surface of said piezoelectric body; and
    a connecting electrode disposed on a fourth outer surface of said piezoelectric body, wherein said fourth outer surface is opposite of said third outer surface.

2. The piezoelectric resonator according to claim 1, wherein said terminal electrode includes a first edge that is disposed on said first outer surface and a second edge that is disposed on said second outer surface.

3. The piezoelectric resonator according to claim 1, wherein said internal electrode is electrically connected to said terminal electrode.

4. The piezoelectric resonator according to claim 1, wherein said connecting electrode is electrically connected to said first excitation electrode and said second excitation electrode.

5. The piezoelectric resonator according to claim 1, wherein said terminal electrode is separated from the first excitation electrode by a distance of Go, and wherein the equation of Go/D≧2.0 is substantially satisfied, wherein D is substantially equal to T/N, and wherein T represents the thickness of the piezoelectric body and N represents the order of harmonic vibrations.

6. The piezoelectric resonator according to claim 1, wherein said terminal electrode is separated from the second excitation electrode by a distance of Go, and wherein the equation of Go/D≧2.0 is substantially satisfied, wherein D is substantially equal to T/N, and wherein T represents the thickness of the piezoelectric body and N represents the order of harmonic vibrations.

7. The piezoelectric resonator according to claim 1, wherein said internal electrode is separated from said connecting electrode by a distance of Gi, and wherein the equation of Gi/D≧2.0 is substantially satisfied, wherein D is substantially equal to T/N, and wherein T represents the thickness of the piezoelectric body and N represents the order of harmonic vibrations.

8. The piezoelectric resonator according to claim 1, wherein said terminal electrode is separated from the first excitation electrode by a distance of Go, and wherein the equation of 2.0≦Go/D≦20 is substantially satisfied, wherein D is substantially equal to T/N, and wherein T represents the thickness of the piezoelectric body and N represents the order of harmonic vibrations.

9. The piezoelectric resonator according to claim 1, further comprising a second internal electrode disposed inside of the piezoelectric body such that the second internal electrode partially overlaps the first excitation electrode, the second excitation electrode, and the internal electrode, wherein the first excitation electrode, the second excitation electrode, and the internal electrode are separated by said plurality of piezoelectric layers.

10. The piezoelectric resonator according to claim 9, wherein the second internal electrode is electrically connected to said connecting electrode.

11. The piezoelectric resonator according to claim 9, wherein said first excitation electrode, said second excitation electrode, said internal electrode, and said second internal electrode are separated by an equal distance from each other.

12. The piezoelectric resonator according to claim 9, wherein adjacent layers of said plurality of piezoelectric layers are polarized oppositely in the thickness direction.

13. The piezoelectric resonator according to claim 9, further comprising a third internal electrode disposed inside of the piezoelectric body such that the third internal electrode partially overlaps the first excitation electrode, the second excitation electrode, the internal electrode, and the second internal electrode.

14. The piezoelectric resonator according to claim 10, wherein said third internal electrode is electrically connected to said terminal electrode.

15. The piezoelectric resonator according to claim 1, further comprising a protuberance disposed inside the piezoelectric body, wherein said protuberance is connected to said connecting terminal.

16. The piezoelectric resonator according to claim 15, wherein said internal electrode is separated from said protuberance by a distance of Gi, and wherein the equation of Gi/D≧2.0 is substantially satisfied, wherein D is substantially equal to T/N, and wherein T represents the thickness of the piezoelectric body and N represents the order of harmonic vibrations.

17. A piezoelectric resonator comprising:
a piezoelectric body;
a first electrode disposed on a first outer surface of said piezoelectric body, said first electrode having a width that is substantially equal to the width of said piezoelectric body;

a second electrode disposed on a second outer surface of said piezoelectric body, wherein said second outer surface is opposite said first outer surface, and wherein said second electrode has a width that is substantially equal to the width of said second outer surface;

a plurality of internal electrodes disposed inside of the piezoelectric body such that the internal electrodes at least partially overlap each other;

a resonating portion defined by an area of overlap between the plurality of internal electrodes; and a plurality of vibration-attenuation portions disposed at two opposite sides of said resonating portion, wherein said plurality of vibration-attenuation portions are arranged to vibrate in an N-order harmonic mode.

18. The piezoelectric resonator according to claim 17, wherein at least one of said plurality of internal electrodes is connected to the first electrode, and wherein at least one of said plurality of internal electrodes is connected to the second electrode.

19. The piezoelectric resonator according to claim 18, further comprising a first protuberance disposed inside the piezoelectric body and connected to said first electrode and a second protuberance disposed inside the piezoelectric body and is connected to said second electrode.

20. The piezoelectric resonator according to claim 19, wherein said first protuberance is separated from one of said plurality of internal electrodes by a distance of Gi, and wherein the equation of Gi/D≧2.0 is substantially satisfied, wherein D is substantially equal to T/N, and wherein T represents the thickness of the piezoelectric body and N represents the order of harmonic vibrations.

21. The piezoelectric resonator according to claim 20, wherein said second protuberance is separated from one of said plurality of internal electrodes by a distance of Gi, and wherein the equation of Gi/D≧2.0 is substantially satisfied, wherein D is substantially equal to T/N, and wherein T represents the thickness of the piezoelectric body and N represents the order of harmonic vibrations.

22. A piezoelectric resonance component comprising:
a substrate;
a piezoelectric resonator mounted on said substrate, wherein said resonator includes:
a piezoelectric body having a plurality of piezoelectric layers;
a first excitation electrode disposed on a first outer surface of said piezoelectric body, said first excitation electrode having a width that is substantially equal to the width of said piezoelectric body;
a second excitation electrode disposed on a second outer surface of said piezoelectric body, wherein said second outer surface is opposite said first outer surface, and wherein said second excitation electrode has a width that is substantially equal to the width of said first excitation electrode;
an internal electrode disposed inside of the piezoelectric body such that the internal electrode partially overlaps both the first excitation electrode and the second excitation electrode;
a resonating portion defined by a portion of overlap between the first excitation electrode, the second excitation electrode, and the internal electrode;

a plurality of vibration-attenuation portions disposed at two opposite sides of said resonating portion, wherein said plurality of vibration-attenuation portions are arranged to vibrate in an N-order harmonic mode;

a terminal electrode disposed on a third outer surface of said piezoelectric body; and a connecting electrode disposed on a fourth outer surface of said piezoelectric body, wherein said fourth outer surface is opposite of said third outer surface, wherein said substrate is arranged to allow for substantially unhindered vibration of said resonator, and wherein said terminal electrode is separated from the first excitation electrode by a distance of Go, and wherein the equation of $Go/D \geq 2.0$ is substantially satisfied, wherein D is substantially equal to T/N, and wherein T represents the thickness of the piezoelectric body and N represents the order of harmonic vibrations.

* * * * *